(12) United States Patent
Raz et al.

(10) Patent No.: US 7,609,759 B2
(45) Date of Patent: Oct. 27, 2009

(54) METHOD AND SYSTEM OF NONLINEAR SIGNAL PROCESSING

(75) Inventors: Gil M. Raz, Concord, MA (US); Cy P. Chan, Cambridge, MA (US)

(73) Assignee: GMR Research & Technology, Inc., Concord, MA (US)

( * ) Notice: Subject to any disclaimer, the term of this patent is extended or adjusted under 35 U.S.C. 154(b) by 585 days.

(21) Appl. No.: 11/280,970

(22) Filed: Nov. 16, 2005

(65) Prior Publication Data

US 2006/0133470 A1 Jun. 22, 2006

Related U.S. Application Data

(60) Provisional application No. 60/628,218, filed on Nov. 16, 2004.

(51) Int. Cl.
*H03H 7/30* (2006.01)
*H03H 7/40* (2006.01)
*H03K 5/159* (2006.01)

(52) U.S. Cl. .................. 375/230; 375/229; 375/231; 375/232; 375/346; 375/350

(58) Field of Classification Search ......... 375/229–236, 375/346–350
See application file for complete search history.

(56) References Cited

U.S. PATENT DOCUMENTS 6,947,509 B1 * 9/2005 Wong .......................... 375/350
7,161,635 B1 * 1/2007 Weston et al. ................ 348/625

* cited by examiner

*Primary Examiner*—Curtis B Odom
(74) *Attorney, Agent, or Firm*—Kriegsman & Kriegsman

(57) ABSTRACT

A nonlinear equalizer for treating the nonlinear component of a distorted digital signal includes a first processing unit adapted to receive the distorted digital signal and yield an appropriate output signal in response thereto, a second processing unit adapted to receive the distorted digital signal and yield an appropriate output signal in response thereto, and a summation module for summing together the output signals from the first and second processing units so as to yield an equalized digital signal. In one embodiment, each of the first and second processing units comprises a linear filter, a partitioning filterbank for partitioning the distorted digital signal, and a multiplier for multiplying together the output of said linear filter with the output of said partitioning filterbank. In use, the nonlinear equalizer can be used to adaptively partition the distorted digital signal so as to allow for nonlinear equalization in a highly efficient manner. Prior to its use in this manner, the coefficient of each linear filter is optimized through the injection of multiple sets of test tones into the nonlinear system.

12 Claims, 16 Drawing Sheets

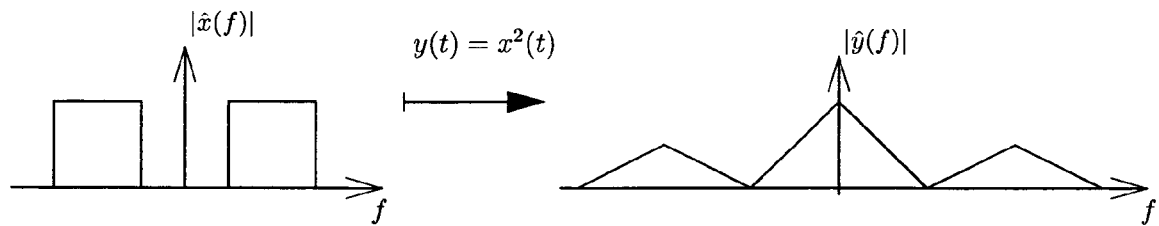
FIG. 11(a)  FIG. 11(b)
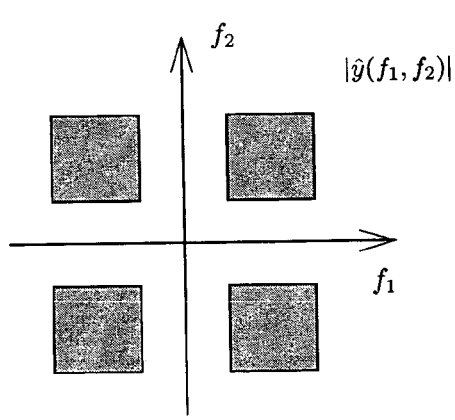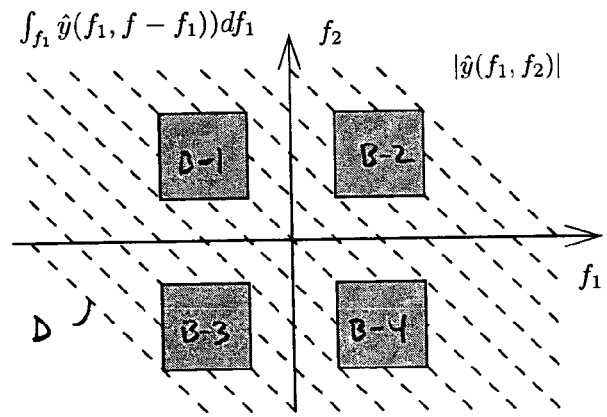
FIG. 11(c)  FIG. 11(d)

Element level digitization

Sub-array digitization

METHOD AND SYSTEM OF NONLINEAR SIGNAL PROCESSING

CROSS-REFERENCE TO RELATED APPLICATIONS

The present application claims the benefit under 35 U.S.C. 119(e) of U.S. provisional Patent Application Ser. No. 60/628,218, filed Nov. 16, 2004, the disclosure of which is incorporated herein by reference.

BACKGROUND OF THE INVENTION

The present invention relates generally to nonlinear systems and more particularly to methods and systems for processing signals generated from nonlinear systems.

Virtually all practically engineered and/or natural systems experience nonlinear behavior. As defined herein, a nonlinear system is a system which exhibits a nonlinear relationship between its input and output (i.e., the system fails to obey the principal of superposition between its input and output). Examples of systems which exhibit nonlinear behavior include, inter alia, most biological systems, fluid flow systems, optical systems, imaging systems, RF receiver and transmitter systems, magnetic devices and magnetic recording systems, analog electronic systems, amplifier systems, loud speaker systems, radar systems and sonar systems.

A signal output from a nonlinear system typically includes a nonlinear component. As defined herein, use of the term signal in conjunction with nonlinear systems is meant to denote both (1) the mathematical description of any measurable phenomena in nature or in human-made systems and (2) the mathematically described function of one or more variable depending on one or more parameters. Examples of signals include, inter alia, light intensity, voltage, pressure, magnetic field strength and electric field strength.

Nonlinearities inherent in a particular system often introduce substantial nonlinear distortion products (e.g., harmonics, intermodulations, spurs, etc.) into the output signal generated by said system. In turn, the introduction of these nonlinear distortion products may limit the ability of signal processors to separate the desired component of the output signal (typically the linear component) therefrom, thereby effectively compromising the overall performance of the system, which is highly undesirable.

As an example, in the field of digital signal communications, an analog-to-digital converter (a device commonly used to convert a signal from the analog domain to the digital domain) as well as traditional front-end devices (e.g., signal amplifiers, analog filters, etc.) often introduce nonlinear irregularities into the communication signal. As will be described further below, the introduction of nonlinear irregularities (also referred to herein as nonlinear distortions) into an output signal effectively limits the overall performance of said nonlinear communication devices.

As can be appreciated, there presently exist a number of well-established devices and mathematical modeling tools for analyzing and treating the linear irregularities of an output signal. However, contrary to its linear counterparts, there presently exist limited devices and mathematical modeling tools for analyzing and treating the nonlinear irregularities of an output signal. In fact, most known mathematical means for processing nonlinear signal irregularities tend to be specialized for particular types of nonlinear systems. In addition, even when said mathematical modeling tools exist, they are often very cumbersome in nature and computationally intensive, which is highly undesirable.

Referring now to FIG. 1, there is shown a graphical representation of a digital output signal that has been generated by a nonlinear system (e.g., a receiver that includes an analog-to-digital converter), the output signal being represented in terms of power as a function of frequency. It should be noted that the graphical representation shown in FIG. 1 is not an actual measured output signal but rather a simplified version of a sample output signal that is useful in understanding the principals of the present invention. It should also be noted that FIG. 1 represents a sample output signal produced in response to the application of a two tone input signal into a nonlinear system. However, it is to be understood that alternative types of input signals (i.e., other than of the two tone variety) would produce similar types of output signals when introduced into the same nonlinear system.

As can be seen, the output signal shown in FIG. 1 includes a representation of the original two tone input signal, the representation of the original two tone input signal being identified by reference numeral 11. However, it should be noted that the nonlinear system additionally introduces noise 13 and nonlinear intermodulation products 15 into the output signal. As defined herein, the term "intermodulation products" relates to the nonlinear distortions that are produced in response to the application of a signal into a nonlinear system.

It should be noted that intermodulation products 15 decrease the portion of the two tone input signal 11 which can be utilized for processing, the strength of the usable portion of the input signal 11 being commonly used to define the dynamic range for the device. Accordingly, it is to be understood that it is a primary object in digital signal processing to treat an output signal with nonlinear irregularities in such as manner so as to reduce the strength of intermodulation products 15 without reducing the strength of the two tone input 11, thereby maximizing the intermodulation-free dynamic range (IFDR). As can be appreciated, the ability to increase the usable portion of the two-tone input signal (i.e., IFDR) has a number of practical applications in the fields of, but not limited to, radar systems, sonar systems and digital communication systems (e.g., increasing signal strength in cellular applications).

In recent years, polynomial difference equation (PDE) filters, and in particular Volterra filters, have been used for nonlinear system representations, in large part because the output is a linear function of the filters parameters. While Volterra filters have been advantageous for nonlinear system representations, there is a disadvantage inherent to this filter representation. Specifically, the disadvantage inherent to the Volterra representation, and other similar nonlinear system representations, is the computational complexity involved in calculating the output. As the polynomial order or memory increases, the number of parameters in the Volterra filter increases rapidly and thus, the number of computations rapidly becomes prohibitive.

In U.S. Pat. No. 6,639,537 to G. M. Raz, the disclosure of which is incorporated herein by reference, there is disclosed a highly linear analog-to-digital (ADC) conversion system that has an analog front-end device in cascade with a standard ADC converter, and a tunable digital nonlinear equalizer. The equalizer corrects the quantization distortion, deviations from ideal response, and additive noises generated by the analog front-end device and ADC converter. The equalizer is formed by three main parts: a generate function streams unit (GFSU), finite inpulse response (FIR) filters and a summer. The equalizer receives the unequalized output from the ADC converter and generates a plurality of monomial streams in a systolic fashion. Each of the monomial streams is passed through a corresponding linear finite impulse response FIR filter. A sum of all outputs from the FIR filters produces a unique equalized output with the nonlinear distortion reduced to a satisfactory level. The FIR filter coefficients are determined by an identity equalizer coefficient unit (IECU), and test signal generator with different types of test signals. The FIR filter coefficients are set to minimize an error function.

Although useful in reducing nonlinear distortions, systems of the type as described above in the '537 patent suffer from a couple notable shortcomings.

As a first drawback, the equalization coefficient for each of the linear filters in the nonlinear equalizer described in the '537 patent has linear relationship with the output signal but, in contrast thereto, has a nonlinear relationship with the input signal. Because the equalization coefficients for the linear filters have a nonlinear correspondence with the input signal, it is to be understood that linear mathematical tools can not be used to perform certain essential calculations, which is highly undesirable.

As a second drawback, the nonlinear equalizer described in the '537 patent provides no means for partitioning an input signal into a plurality of subspace components, thereby limiting its performance in certain applications. For instance, the nonlinear equalizer described in the '537 patent can not perform linear equalization of a wide-band system using narrow-band filtering tools, which is highly undesirable.

SUMMARY OF THE INVENTION

It is an object of the present invention to provide a novel method and system for reducing nonlinearities in a distorted digital signal.

It is another object of the present invention to provide a method and system as described above which utilize mathematical modeling tools which are neither cumbersome nor computationally complex in nature and therefore are readily realizable in real-time hardware even for very wideband systems.

It is yet another object of the present invention to provide a method and system as described above which allows for the partitioning of said distorted digital signal into a plurality of subspace components.

Therefore, according to one feature of the present invention, there is provided a nonlinear equalizer for treating the nonlinear component of a distorted digital signal, said nonlinear equalizer comprising (a) a first processing unit adapted to receive the distorted digital signal and yield an appropriate output signal in response thereto, (b) a second processing unit adapted to receive the distorted digital signal and yield an appropriate output signal in response thereto, (c) a summation module for summing together the output signals from the first and second processing units so as to yield an equalized digital signal, and (d) wherein each of said first and second processing units includes means for partitioning the distorted digital signal.

According to another feature of the present invention, there is provided a nonlinear equalizer for treating the nonlinear component of a distorted digital signal, said nonlinear equalizer comprising (a) a first processing unit adapted to receive the distorted digital signal and yield an appropriate output signal in response thereto, (b) a second processing unit adapted to receive the distorted digital signal and yield an appropriate output signal in response thereto, (c) a partitioning filterbank that is commonly coupled to each of said first and second processing units, and (d) a summation module for summing together the output signals from the first and second processing units so as to yield an equalized digital signal.

According to another feature of the present invention, there is provided a method of treating the nonlinear component of a distorted digital signal produced by a nonlinear system, said method comprising the steps of (a) partitioning said distorted digital signal using a partitioning filterbank, the partitioning filterbank comprising a plurality of partition filters, the outputs of said plurality of partition filters being multiplied together, and (b) after said partitioning step, equalizing the partitioned digital signal using a linear filter.

Various other features and advantages will appear from the description to follow. In the description, reference is made to the accompanying drawings which form a part thereof, and in which is shown by way of illustration, various embodiments for practicing the invention. The embodiments will be described in sufficient detail to enable those skilled in the art to practice the invention, and it is to be understood that other embodiments may be utilized and that structural changes may be made without departing from the scope of the invention. The following detailed description is therefore, not to be taken in a limiting sense, and the scope of the present invention is best defined by the appended claims.

BRIEF DESCRIPTION OF THE DRAWINGS

In the drawings wherein like reference numerals represent like parts:

FIGS. 11(a)-(d) are various graphical representations which are useful in displaying the benefits of the equalizer shown in FIG. 9 performing nonlinear signal reductions in multi-dimensioned space;

DETAILED DESCRIPTION OF THE PREFERRED EMBODIMENT

Figure 1:
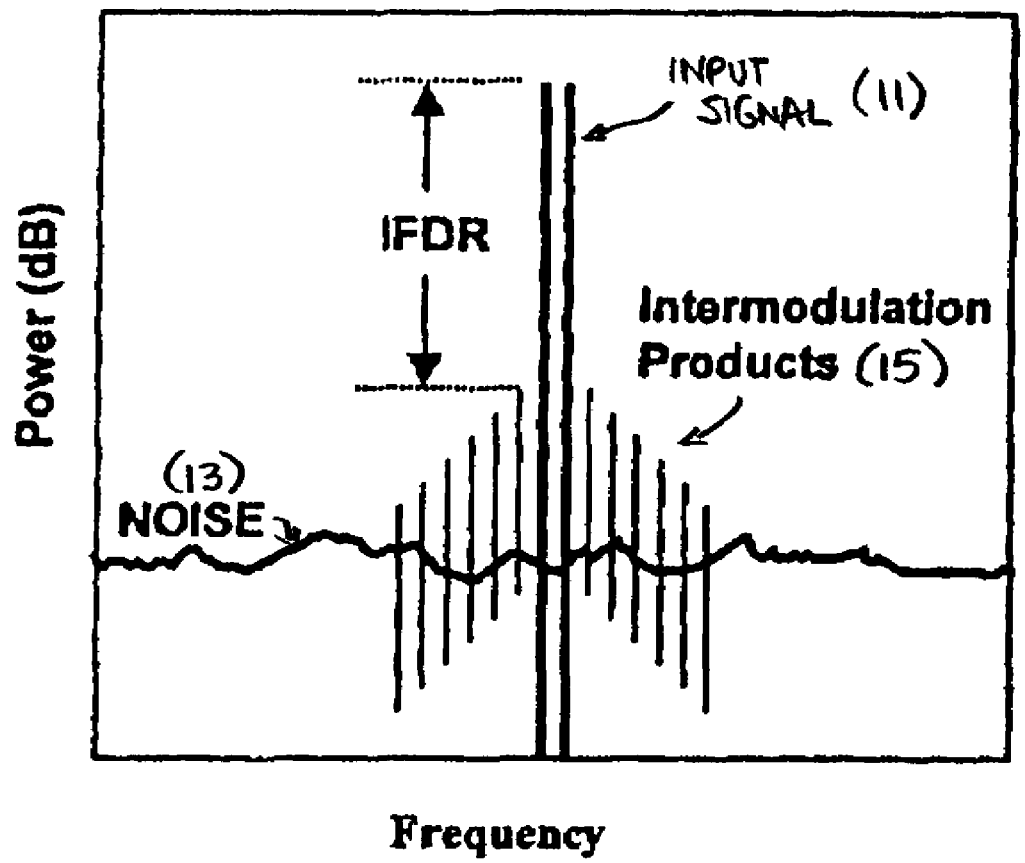
FIG. 1 is a simplified graphical representation of a digital output signal generated in response to the application of a two tone input signal into a nonlinear system which is well-known in the art.
Figure 2:
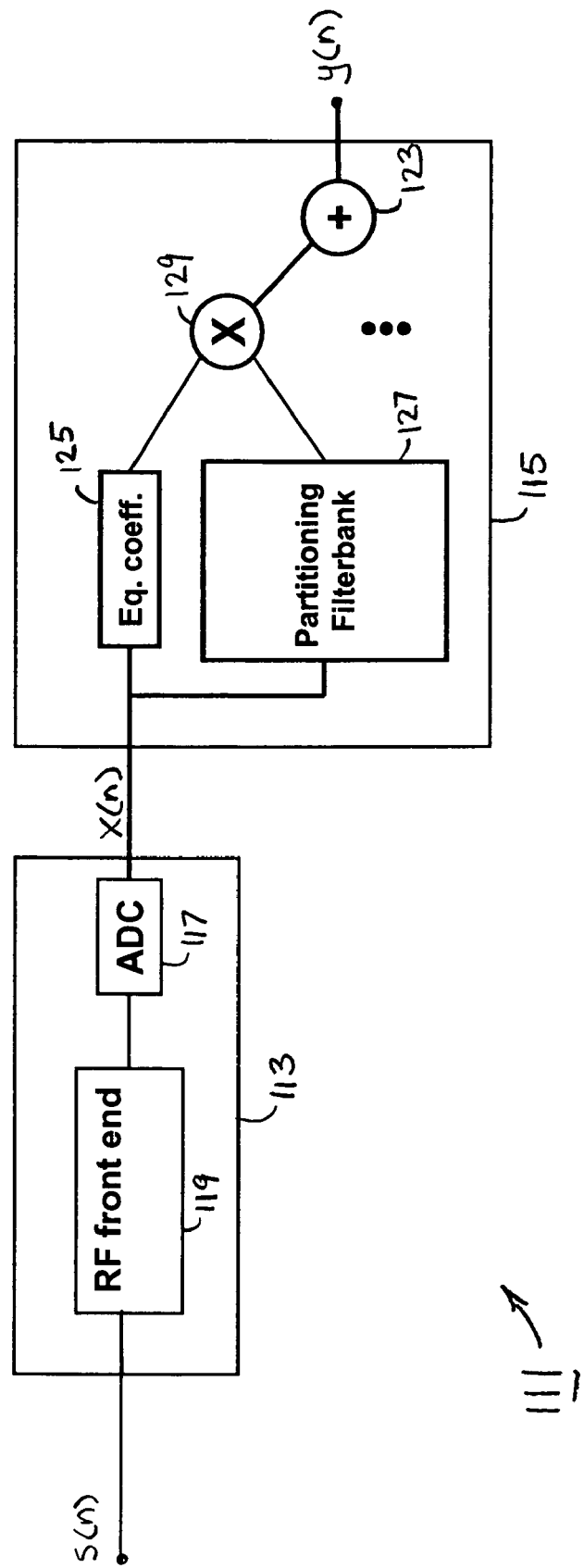
FIG. 2 is a schematic representation of a signal processing system that is constructed according to the teachings of the present invention.

Referring now to FIG. 2, there is shown a signal processing system constructed according to the teachings of the present invention and identified generally by reference numeral 111. As can been seen, system 111 includes a nonlinear subsystem 113 and a nonlinear equalizer (NLEQ) 115. As will be described in detail below, NLEQ 115 is designed to minimize nonlinear signal distortions produced by subsystem 113 and, in this capacity, serves as the principal novel feature of the present invention. The description that follows below will detail the architecture of NLEQ 115, methods for identifying the optimal substructure for NLEQ 115 (including linear filter coefficients), and novel parsimonious methods for exciting the various nonlinear modalities of subsystem 113 for purposes of identification.

As defined herein, nonlinear subsystem 113 represents any system that exhibits nonlinear behavior (e.g., biological systems, fluid flow systems, optical systems, imaging systems, RF receiver and transmitter systems, magnetic devices and magnetic recording systems, analog electronic systems, amplifier systems, loud speaker systems, radar systems, etc.). For purposes of simplicity only, nonlinear subsystem 113 is represented in FIG. 2 as being in the form of a conventional receiver. However, it is to be understood that nonlinear subsystem 113 could be in the form of any alternative type of well-known nonlinear system without departing from the spirit of the present invention.

Use of the term "signal" in conjunction with the present invention is not limited to a digital signal but rather is meant to denote both (1) the mathematical description of any measurable phenomena in nature or in human-made systems and (2) the mathematically described function of one or more variable depending on one or more parameters. Examples of types of signals which are encompassed in the present invention include, inter alia, light intensity, voltage, pressure, magnetic field strength and electric field strength.

As noted above, nonlinear subsystem 113 is represented herein as being in the form of a receiver that is conventional in construction. Specifically, nonlinear subsystem 113 includes an analog-to-digital converter (ADC) 117 which is preceded by an analog front-end device 119, such as a low noise amplifier. In use, an analog input signal s(n) introduced into nonlinear subsystem 113 is first conditioned by front-end device 119 and then converted into a distorted, received digital signal x(n) by ADC 117. As can be appreciated, the nonlinear devices in subsystem 113 are responsible for introducing the nonlinear irregularities into digital signal x(n).

NLEQ 115 is a digital nonlinear filter structure that is connected to the output of nonlinear subsystem 113. One means by which NLEQ 115 is implemented is using a systolic array very large-scale integration (VLSI) architecture. However, it should be noted that alternative well-known means for implementing NLEQ 115 could be used in place thereof without departing from the spirit of the present invention.

In use, NLEQ 115 serves to minimize the nonlinear irregularities that are present in distorted digital signal x(n) as a result of nonlinear subsystem 113, NLEQ 115 treating distorted digital signal x(n) in such a manner so as to yield an equalized digital signal y(n). As will be described below, the particular architecture of NLEQ 115 serves as one of the principal novel features of the present inveniton.

Nonlinear Equalizer (NLEQ) Architecture

Figure 3:
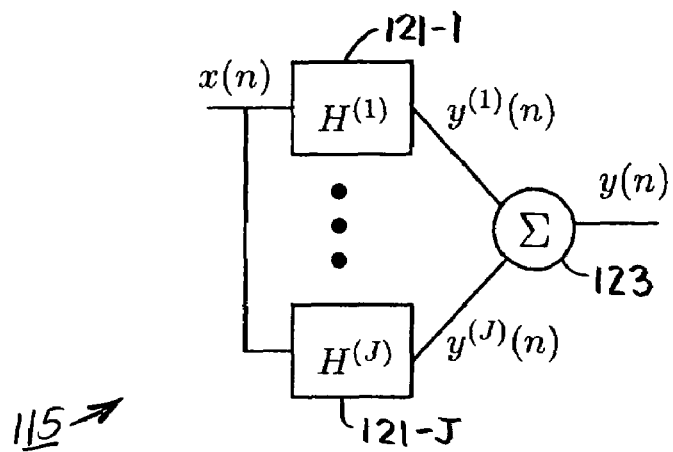
FIG. 3 is a schematic representation of the nonlinear equalizer shown in FIG. 2.

Referring now to FIG. 3, the architecture for NLEQ 115 (also referred to herein as the partitional horizontal coordinate system, or PHoCS, 115) is shown. As can be seen, NLEQ 115 comprises a plurality of processing units $H^{(1)}$ through $H^{(J)}$ which are identified generally by reference numerals 121-1 through 121-J, respectively. The outputs of the various processing units 121 are summed together by means of a summation module 123.

In use, the application of a distorted digital input signal x(n) to NLEQ 115 (e.g., of the type generated by nonlinear subsystem 113) causes each processing unit $H^{(j)}$ to, in turn, generate an appropriate output signal $y^{(j)}(n)$. The summation of all the output signals $y^{(j)}(n)$ from the various processing units 121 creates an equalized output signal y(n) which is highly linear in nature, as noted above.

Figure 4:
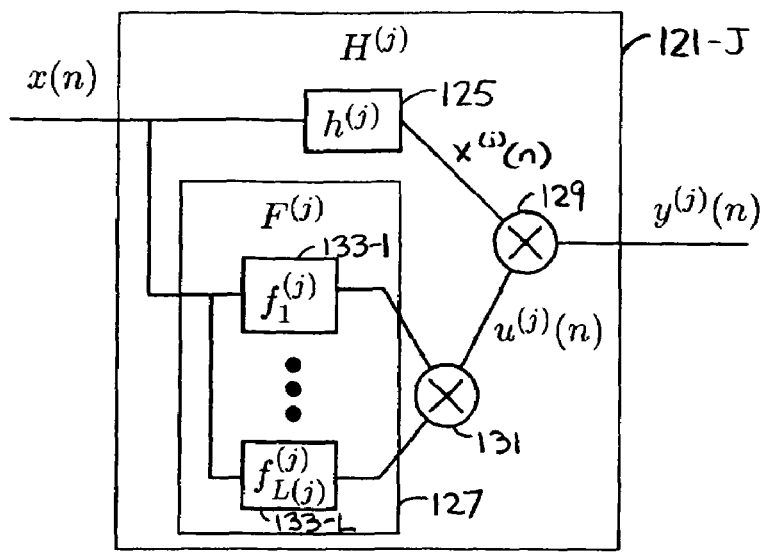
FIG. 4 is a schematic representation of one of the processing units shown in FIG. 3.

Referring now to FIG. 4, each processing unit 121 is shown in greater detail. Specifically, each processing unit $H^{(j)}$ includes a linear filter $h^{(j)}$, said linear filter being identified herein by reference numeral 125. As will be discussed further in detail below, the equalization coefficient for linear filter 125 has a linear relationship with both input signal x(n) and output signal y(n) even though processing unit 121 itself is a nonlinear device. As a result, by establishing the optimized coefficient for linear filter 125, the nonlinear distortion present in input signal x(n) can be dramatically reduced using linear mathematical filtering tools.

Linear filter 125 is preferably in the form of a finite-duration impulse response (FIR) filter which can be identified and optimized to produce the desired behavior of the system. However, it is to be understood that alternative types of linear filters (e.g., an infinite impulse response (IIR) filter) could be used in place of an FIR filter without departing from the spirit of the present invention.

Linear filter 125 is multiplied by a partitioning filterbank 127 by means of a multiplier 129. As such, the multiplication of the output $x^{(j)}(n)$ for linear filter 125 with the output $u^{(j)}(n)$ of partitioning filterbank 127 yields the output signal $y^{(j)}(n)$ for each processing unit $H^{(J)}$.

Partitioning filterbank 127 preferably includes a plurality of linear partition filters $f_1^{(j)}$ through $f_{L(j)}^{(j)}$ that are multiplied together by means of a multiplier 131 to yield filterbank output signal $u^{(j)}(n)$, partition filters $f_1^{(j)}$ through $f_{L(j)}^{(j)}$ being identified herein by references numbers 133-1 through 133-L.

The function of partitioning filterbank 127 is to partition (i.e., break-up) the input signal x(n) into a plurality of subcomponents. As can be appreciated, the ability to partition the distorted digital signal x(n) into a plurality of sub-components introduces a number of practical advantages.

As a first advantage, partitioning filterbank 127 may be used to partition the bandwidth of input signal x(n) into a plurality of subbands. As a result, NLEQ 115 is provided with the processing power benefits in a wide band system that are normally achieved with narrow band systems, which is highly desirable. A significant benefit derived from this form of partitioning is the significant increase in numerical stability that is achieved during the coefficient identification stage, which will be discussed in detail below.

As a second advantage, partitioning filterbank 127 may be used to partition input signal x(n) into a plurality of different signal types or classes (i.e., signal subspaces). In this manner, NLEQ 111 is able to partition an input signal x(n) into a plurality of subspace components that, in turn, may warrant individualized attention and analysis (i.e., by taking into account adaptive or a priori knowledge of the signal space). For instance, if a target signal has a known modulation scheme or if a jammer signal (in radar applications) has a known form that can be exploited, partition filters 133 can effectively be used to identify and treat the particular signal class. A significant benefit derived from this form of partitioning is that the performance of NLEQ 115 can be maximized in relation to restrictions in its size, weight, power and/or cost, which is highly desirable.

As a third advantage, if the substructure for nonlinear subsystem 113 is known, the particular architecture for NLEQ 115 may be customized to most effectively treat nonlinear modalities in nonlinear subsystem 113. More specifically, individual partition filters 133 in partitioning filterbank 131 can be effectively "assigned" to treat particular nonlinear modalities in nonlinear subsystem 113 (i.e, each partition filter is assigned a device dependent function). As an example, if NLEQ 115 is used to treat an analog-to-digital converter with known quantization distortions, individual partition filters 133 in partitioning filterbank 131 can be effectively assigned to address particular quantization distortions (i.e., using partitioning filters 133 similar to Haar filters to address quantization distortions in the ADC). Further applications associated with this advantage will be discussed in greater in the applications section that follows below.

Preferably, each partitioning filter 133 is in the form of an FIR filter. However, it is to be understood that partitioning filters 133 could be in the form of alternative types of filters (e.g., delay filters) without departing from the spirit of the present invention.

It should be noted that, for infinite-precision operations, the order of the multiplications inside each processing unit 125 is not of particular significance (i.e., the outputs of partition filters 133-1 through 133-L could be multiplied in any order without any affect on the system). However, in practical operations, the precision of the operators and the data lines is finite. As a consequence, the order of multiplications inside each processing unit 125 is of notable significance. Accordingly, the particular process for determining the order of said filter multiplications serves as a novel feature of the present invention and, as such, is described further in detail below.

As can be readily appreciated, the architecture for PHoCS 115 is inherently nonlinear. Stated another way, the output y(n) is nonlinearly related to the input x(n). However, as will be proven mathematically below, output y(n) is linearly dependent upon the coefficient of filters 125. This linear dependency is particularly useful in the context of identifying and tracking the value of said filter coefficients, since techniques for optimizing linear signals are readily available, well-researched and easy to use.

In addition, it should be noted that signal x(n) is similarly linearly dependent upon the coefficients of filters 125 in the sense that filters 125 process signal x(n) directly rather than processing some nonlinear combination of the signal x(n) as in canonical Volterra filter implementations or even in efficient structures, such as diagonal coordinate systems (DCS).

The mathematical display of the linear dependence of the equalization coefficient h for linear filters 125 with respect to both the distorted digital signal x(n) and the equalized output signal y(n) follows herewith:

$$\text{The output of the } PHoCS \text{ processor is } y = \sum_{j=1}^{J} y^{(j)}. \tag{1}$$

Here (2)
$y^{(j)}(n) = u^{(j)}(n)(x * h^{(j)})(n)$
where $*$ denotes the convolution operator. Let $U^{(j)} =$
$diag(u^{(j)})$ and $T^{(j)}[x]$ is the Toeplitz matrix whose first column is
$x$ with the number of columns commensurate with the length
of the filter $h^{(j)}$. Then we rewrite (2) in vector-matrix form as $$y^{(j)} = U^{(j)} T^{(j)}[x] h^{(j)}. \tag{3}$$

Let us futher denote $U = [U^{(1)} \ldots U^{(J)}]$, (4)

$$T[x] = \begin{bmatrix} T^{(1)}[x] & & \\ & \ddots & \\ & & T^{(J)}[x] \end{bmatrix}, \quad h = \begin{bmatrix} h^{(1)} \\ \vdots \\ h^{(J)} \end{bmatrix}.$$

Then (1) is rewritten as (5)
$y = UT[x]h$,
which shows the linar dependance
of the output on the filter coefficients Using the above-described principles, any nonlinear distortion present in signal x(n) can be dramatically reduced in output signal y(n) by establishing the optimal coefficient h for linear filter 125, said process for establishing the optimal coefficient for linear filter 125 to be described in detail below.

It should be noted that NLEQ 115 is not limited to the particular construction as represented herein. Rather, numerous structural modifications could be made to NLEQ 115 without departing from the spirit of the present invention.

For example, each processing unit 121 of NLEQ 115 includes a plurality of partition filters 133. However, in practical applications, it is more likely than not that each processing unit 121 will utilize partition filters 133 which differ only in their delay value. Rather than provide a separate partitioning filterbank 127 for each processing unit 121, NLEQ 115 may be redesigned so as to include a single partitioning filterbank that is commonly combined with each of the individual processing units.

Figure 5:
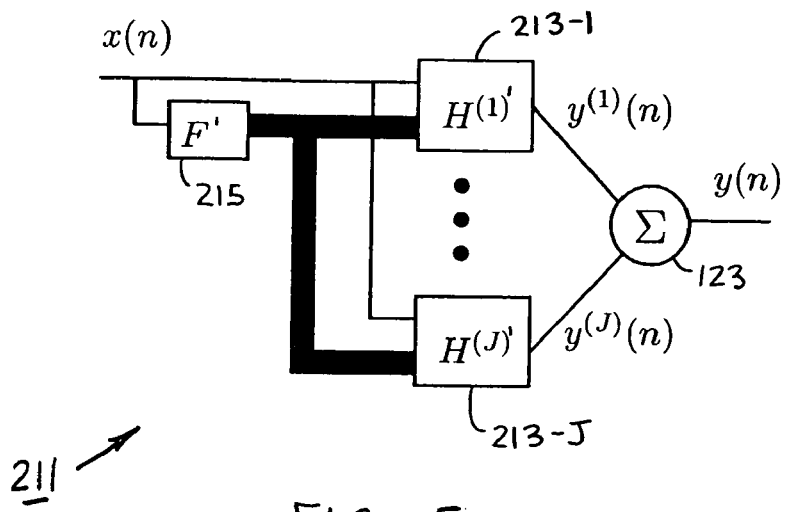
FIG. 5 is a schematic representation of another embodiment of a nonlinear equalizer that can be used in place of the nonlinear equalizer shown in FIG. 2, the multiple outputs from the partitioning filterbank being represented by a single bold line for purposes of simplicity only.

Specifically, referring now to FIG. 5, there is shown a more efficient version of nonlinear equalizer 115, said more efficient version of NLEQ being identified generally by reference numeral 211. As can be seen, NLEQ 211 is similar to NLEQ 115 in that NLEQ 211 comprises a plurality of processing units $H^{(1)'}$ through $H^{(J)'}$ which are identified generally by reference numerals 213-1 through 213-J. The outputs of the various processing units 213 are summed together by means of summation module 123.

However, NLEQ 211 differs from NLEQ 115 in two principal ways.

As a first distinction, NLEQ 211 includes a single partitioning filterbank 215 that is commonly combined with each of the individual processing units 213, the result of the various multiplication processes of the partitioning filter outputs being represented herein by a single bold line for ease of illustration only. As noted above, the use of a single common filterbank 215 renders NLEQ 211 more efficient that NLEQ 115 (i.e., less computationally complex).

Figure 6:
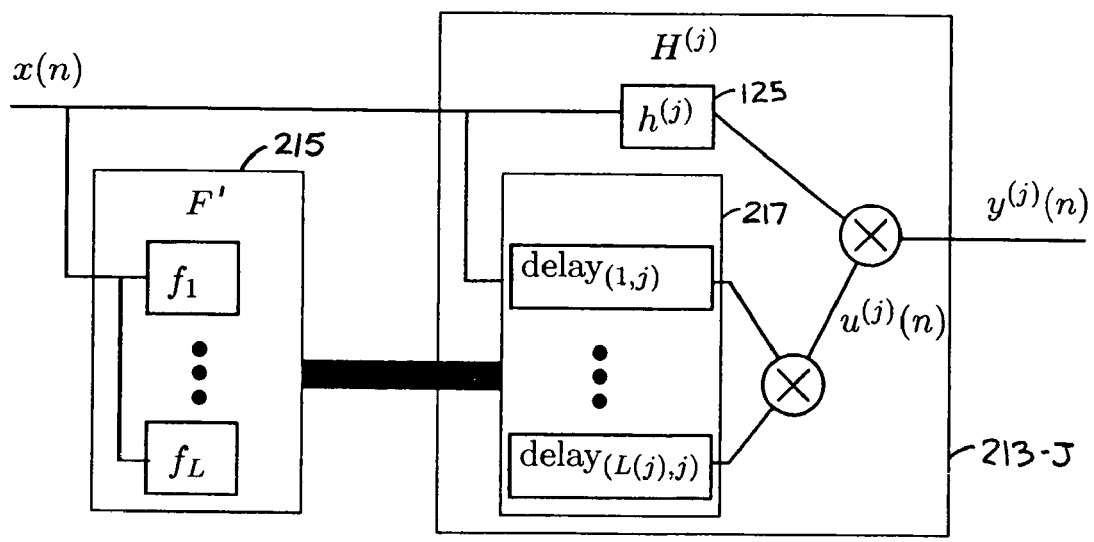
FIG. 6 is a partial schematic representation of the nonlinear equalizer shown in FIG. 5, said representation providing the schematics for the partitioning filterbank as well as for one processing unit, the multiple outputs from the partitioning filterbank being represented by a single bold line for purposes of simplicity only.

As a second distinction, in place of partitioning filterbank 127, each of the individual processing units 213 in NLEQ 211 includes an array of delay filters 217, as seen most clearly in FIG. 6.

Figure 7:
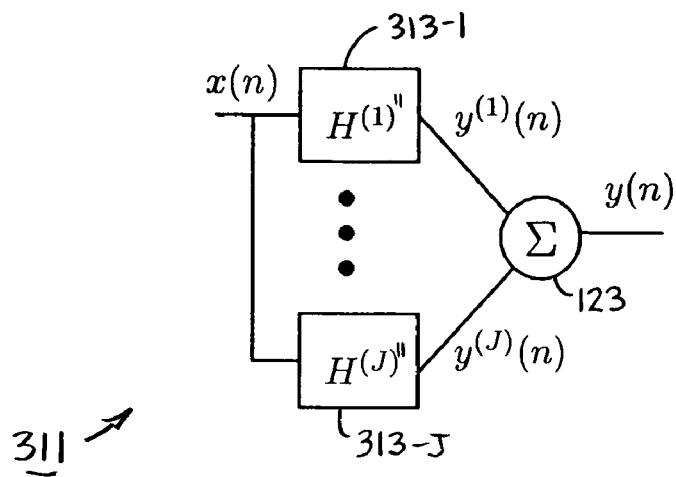
FIG. 7 is a schematic representation of another embodiment of a nonlinear equalizer that can be used in place of the nonlinear equalizer shown in FIG. 2.
Figure 8:
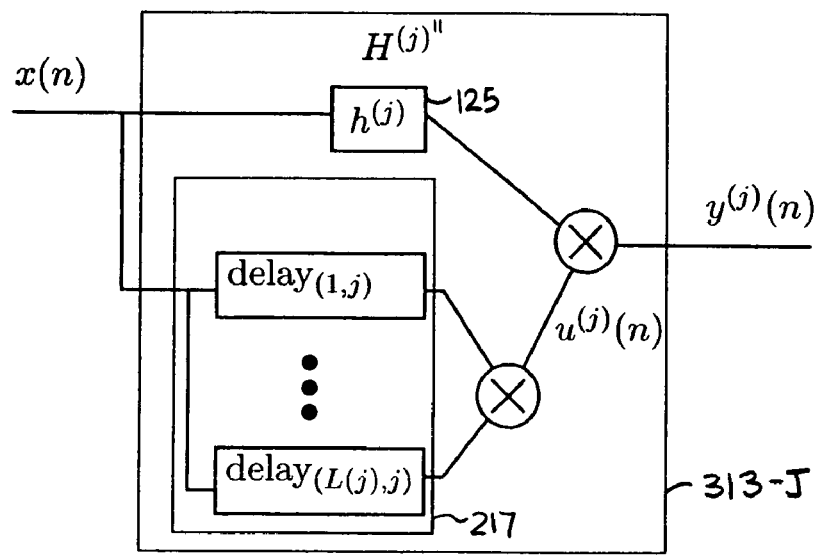
FIG. 8 is a schematic representation of one of the processing units shown in FIG. 7.

As another example of a structural modification that could be made to NLEQ 115, it should be noted that the use of partition filters 133 in NLEQ 115 may not be particularly advantageous in certain applications. Accordingly, referring now to FIG. 7, there is shown another version of a nonlinear equalizer (NLEQ), said NLEQ being identified generally by reference numeral 311. As can be seen, NLEQ 311 is similar to NLEQ 115 in that NLEQ 311 comprises a plurality of processing units $H^{(1)''}$ through $H^{(J)''}$ which are identified generally by reference numerals 313-1 through 313-J. The outputs of the various processing units 313 are summed together by means of summation module 123.

NLEQ 311 differs from NLEQ 115 in that each of the individual processing units 313 in NLEQ 311 includes a linear filter 125 that is multiplied by an array of delay filters 217 (rather than by a partitioning filterbank as in NLEQ 115). Due to this distinction, NLEQ 311 can be viewed as a coordinate transform from canonical Volterra filter implementation and, as such, is defined herein as a Horizontal Coordinate System (HCS).

It should be noted that, while HCS 311 does not have the full functionality of PHoCS 115, HCS 311 is clearly simpler to implement with lower computational complexity than PHoCS 311. In fact, HCS 311 can implement any Volterra filter while retaining the benefits of having its coefficient maintain a linear relationship with respect to both distorted digital signal x(n) and equalized digital signal y(n).

Identification and Tracking of Optimal Equalizer Coefficient

Before NLEQ 115 can be used to minimize the nonlinear distortion present in distorted digital signal x(n), it is to be understood that the optimal (or near-optimal) coefficient value for each linear filter 125 in NLEQ 115 needs to be calculated. The particular method for identifying the optimized equalizer coefficients is described in detail below. It is to be understood that said method has novel aspects which yield a number of notable benefits and, as such, serves as a principal novel feature of the present invention.

Figure 9:
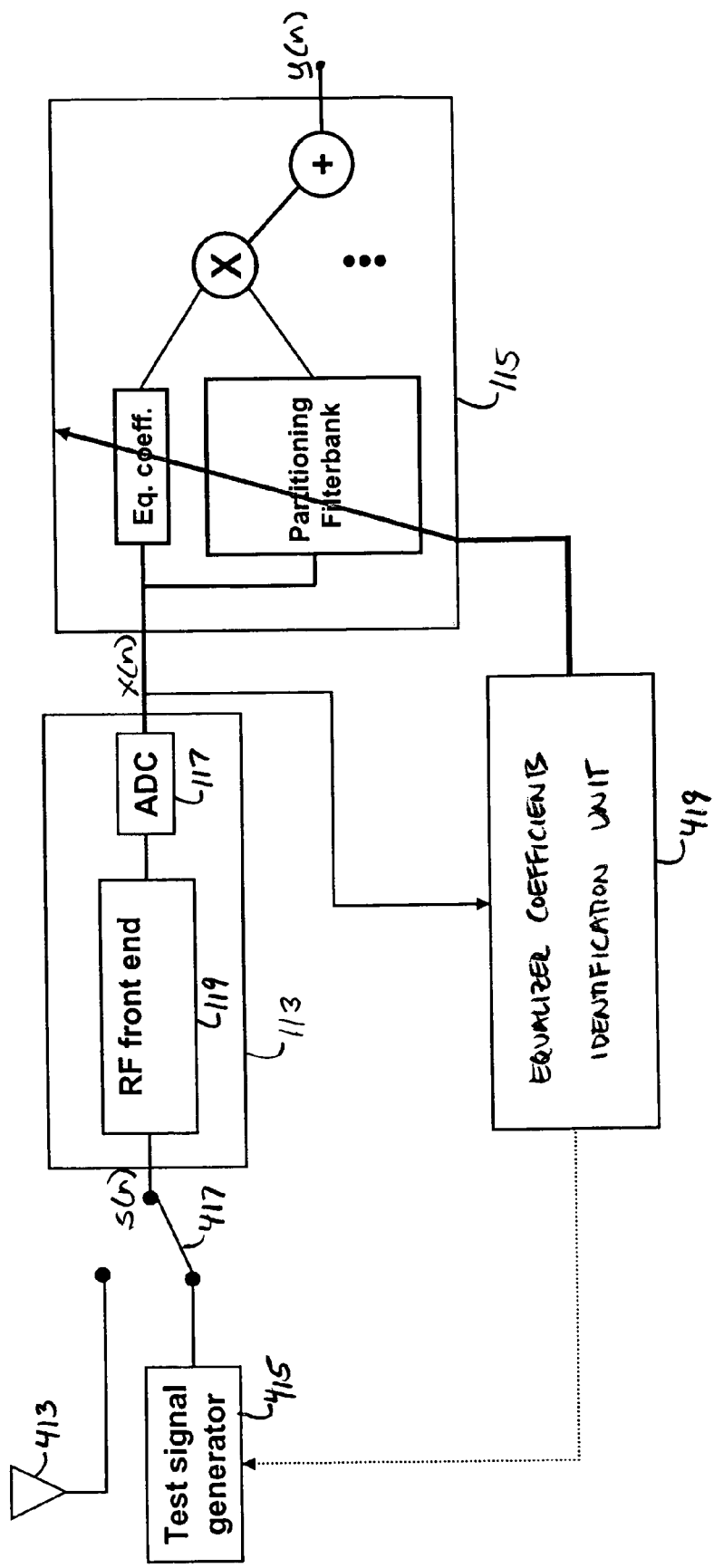
FIG. 9 is a schematic representation of a highly linear signal processing system that is constructed according to the teachings of the present invention.

Referring now to FIG. 9, there is shown a highly linear signal processing system, the system being constructed according to the present invention and identified generally by reference numeral 411.

System 411 is similar to system 111 in that system comprises a nonlinear subsystem 113 (represented herein as a receiver for simplicity purposes only) that is coupled to digital nonlinear filter 115. As noted above, an analog input signal s(n) received by nonlinear subsystem 113 is first conditioned by front-end device 119 and then converted into a distorted, received digital signal x(n) by ADC 117. In turn, NLEQ 115 minimizes the nonlinear irregularities present in distorted signal x(n) so as to yield an equalized digital signal y(n).

The input for nonlinear subsystem 113 is connected to an antenna 413 and a test signal generator 415 by means of a single pole, double throw switch 417. In use, switch 417 is normally disposed so as to couple antenna 413 with nonlinear subsystem 113. As such, an analog signal received by antenna 413 is treated by nonlinear subsystem 113 and, subsequent thereto, linearized by NLEQ 115.

However, prior its operation in this manner, NLEQ 115 must undergo an initial "factory" setting process by which the values of its equalization coefficients are optimized to most effectively minimize the particular nonlinear distortions created by nonlinear subsystem 113 (i.e., NLEQ 115 requires customization for the particular nonlinear system with which is to be used).

An equalizer coefficients identification unit 419 is provided to perform the coefficients optimization process. As can be seen, unit 419 is connected to test signal generator 415, NLEQ 115 and the output of nonlinear subsystem 113. It is to be understood that unit 419 may implemented using any well-known processing device, such as a personal computer, field programmable gate array (FPGA) or any other similar processing device.

In order to commence the coefficients optimization process, switch 417 is disposed so as to connect test signal generator 415 with nonlinear subsystem 113 (as shown in FIG. 9). With switch 417 disposed as such, unit 419 instructs test signal generator 415 to inject one or more sets of analog input signals s(n) into nonlinear subsystem 113. It should be noted that the particular type of signal sets generated by test signal generator 415 serves as a novel feature of the present invention and, as consequence, is described in greater detail further below.

The distorted output signal x(n) produced by nonlinear subsystem 113 in response to having received said test signals is then measured and analyzed by equalizer coefficients identification unit 419. In turn, unit 419 selects the appropriate values for the equalizer coefficients and programs said values into NLEQ 115 accordingly.

As noted above, because the equalizer coefficients have a linear relationship with respect to both distorted digital signal x(n) and equalized output signal y(n), equalizer coefficients identification unit 419 can perform the necessary equalizer coefficients calculations using traditional linear mathematical tools which are both well-defined and of limited complexity, which is highly desirable.

For example, the identification of the optimized linear filter coefficients can be performed using the following three-step method.

In the first step, the particular partition filters (if present in the nonlinear equalizer architecture) are chosen either (1) a priori using well-known techniques or (2) based upon any adaptive or a priori knowledge of analog input signal s(n). It is to be understood that this step in selecting particular partition filters is relatively straight-forward based on the particular signal to be processed by nonlinear subsystem 113.

In the second step, the particular partition filters and/or delay filters, as well as the order of multiplication for said partition filters and/or delay filters needs to be optimized. It is to be understood that both the selection of said filters and the optimization of the order of multiplications for said filters can be performed using well-known techniques.

In the third step, the optimized value of the equalization coefficients can be calculated in a number of different ways including, but not limited to, (1) use of the least-squares solution as described in U.S. Pat. No. 6,639,537 to G. M. Raz, which is incorporated herein by reference, (2) use of the standard linear equation y=UT[x]h, which is described in detail above, (3) the reuse of partial matrix factorizations, or (4) use of any a priori or adaptive knowledge of the input signal. It should be noted that, other than choosing new partition filters adaptively, all other tracking of equalization coefficients can be achieved using linear-like techniques due to the particular architecture of PHoCS 115, which is highly desirable.

It should be noted that the determination of optimal coefficients is but one part of the identification process. If the exact structure of each processing unit 121 in NLEQ 115 is given, the best coefficient for each processing unit 121 can be determined using well established methods, such as the least squares method. However, it is not usually known a priori what structure for NLEQ 115 will best suit the nonlinear system that requires equalization. Therefore, the design of NLEQ 115 allows for the selection of not only the coefficients to place within the various processing units 121 but also the structures of the processing units themselves for use during identification.

Accordingly, a "greedy" processing unit selection process makes sense from a computational standpoint and is described as follows. During the identification process, a pool of candidate processing unit structures are designated. This pool can contain processing units of varying degrees and preprocessing delay and with various partitioning filters and delays. The identification algorithm then chooses an "optimal" combination of processing units and their associated coefficients by incrementally selecting the processing unit that achieves the best performance in combination with those processing units already selected. This method has been found to achieve very good results while keeping the computational cost of identification at reasonable levels.

With the linear filters for NLEQ 115 now optimized, switch 417 can be disposed back to its "normal" configuration (i.e., with antenna 413 coupled to nonlinear subsystem 113). With the coefficients for NLEQ 115 now optimized, it is to be understood that any analog signal s(n) received by antenna 413 and, in turn, processed by nonlinear subsystem 113 is then linearized in its most optimal manner by NLEQ 115, which is a principal object of the present invention.

It is to be understood that, even after the initial "factory" setting of the equalizer coefficients as described above, system 411 can be used to effectively track whether the equalization coefficients effectively maintain their optimized setting. In particular, it should be noted that various external conditions (e.g., thermal fluctuations, aging, radiation damage, etc.) can compromise the effectiveness of the initial coefficient calculation process. As a result, a secondary, or "tracking-based", optimization process can be undertaken using similar techniques as described above to update the equalizer coefficients to their most optimized state.

In a similar manner, when adaptive or a priori knowledge of a particular signal or distortion subspace is known, this external knowledge may be similarly used to update the optimized coefficient values for NLEQ 115.

The calculation of the optimized equalization coefficients is accomplished digitally within the microprocessor architecture for NLEQ 115. Accordingly, it is to be understood that a particular register (i.e., a specialized storage element) is provided in the microprocessor that includes a string of bits which together allow for a digital representation of each equalization coefficient value. As such, the process for selecting the particular number of bits, point system and algebraic approach for representing said register in the microprocessor is of primary significance in maximizing the performance ultimately achieved by NLEQ 115.

In particular, it is to be understood that a dichotomy in chip design often exists between minimizing the word size of a register in order to reduce chip size/cost and maximizing the word size of a register in order to optimize performance (wherein the greater number of bits provided for a register correlates into greater accuracy of calculations performed therewith). As defined herein, the term "word size" relates the specified number of digital units, or bits, that are used to convey a numerical value.

Typically, the digital processing of nonlinear mathematical tools requires considerable word sizes due to the high number of multiplications typically undertaken. For example, the multiplication of an 8-bit piece of data with another 8-bit piece of data would require approximately 16 bits without risking the loss of any information, wherein further multiplication processes can cause word size requirements to grow exponentially. As a consequence, all of the benefits achieved using NLEQ 115 could be reduced "at the backside" either (1) by selecting a particular register for the calculations that does not include the requisite number of bits or (2) by using many bits per word which, in turn, makes real-time implementations impractical. In linear signal processing, the number of bits selected for equalization is typically commensurate with the difference overall in the signal-to-noise ratio. However, since the IFDR is significantly less than the SNR, it is to be understood that nonlinear signal processing can be calculated using registers with a smaller word size.

As noted above, digital calculations are also largely dependent upon whether a fixed-point representation or floating-point representation is used with respect to the particular register (i.e., fixed-point or floating-point representations). The primary benefit associated with a fixed-point representation is that both very large as well as very small numerical values can be represented using a register that has a limited number of bits, thereby reducing the overall size and cost of the microprocessor. However, it has been found that, as a trade-off, fixed-point representations often sacrifice a considerable degree of accuracy that can be achieved using a floating-point representation.

As such, it is to be understood that the present invention attempts to create a hybrid representation of its calculation register, said hybrid being defined herein as a "block floating point" system that combines both fixed point and floating point features. In particular, it is to be understood that present invention may utilize either the "residue algebra" approach, the "bit-shift multiplication" approach or the "combined approach" described in detail in U.S. Pat. No. 6,639,537 to G. M. Raz, said patent being incorporated herein by reference, with respect to the register used to calculate the particular equalization coefficients.

When used to equalize a MAX108 analog-to-digital converter of the type manufactured and sold by Maxim Integrated Products, Inc., of Sunnyvale, Calif., it has been found that utilizing a 7-bit or 8-bit fixed point representation in NLEQ 115 at 500 MHz provides equivalent results in performance to a floating point representation, which is highly desirable.

It is also to be understood that the particulars of the register used to perform selected calculations may vary based on particular nonlinear modalities (e.g., $2^{nd}$ order or $3^{rd}$ order nonlinear component) produced by the nonlinear subsystem. By virtue of this form of "localization," the word size of the various registers can be minimized, thereby reducing microprocessor size. For example, different algebraic techniques for representing a particular coefficient (e.g., 7 bit register with 2 bits overflow and 3 bits shifting) may be used in conjunction with one nonlinear modality whereas other algebraic techniques for representing coefficient values may be used for other nonlinear modalities. The combination of all of the various techniques may be fused together into a single microprocessor using the "block floating point" technique (i.e., whenever two or more sections of NLEQ 115 are combined, the result must be of the same exponent).

During the co-design of software and hardware, feedback influences design decisions through the identification and implementation processes. One of the parameters that can be optimized during this process is the word size of each data path. Through various test and checking procedures, a power-size-performance trade-off curve can be established so as to implement the most optimal equalization device given a specific application environment.

It should be noted that the determination of proper block offsets is vital in the evaluation of possible word sizes. Techniques, such as residue algebra and data profiling, are used to determine the proper offsets that will maximize the dynamic range of the data path given the available number of bits.

Excitation Techniques for Identifying Filter Coefficients

As described in detail above, test signal generator 415 is used to inject user-defined test signals (also referred to herein as excitation signals) into nonlinear subsystem 113, the output signal resulting therefrom being analyzed by equalizer coefficients identification unit 419 in order to optimize the operation of NLEQ 115. As such, it can be said simply that the injection of test signals can be used to excite the nonlinearities inherent in subsystem 113.

It is to be understood that particular benefits arise based on the type of test signal that is injected into nonlinear subsystem 113 to excite the various nonlinearities inherent therein. As such, the particular test signals used to excite nonlinearities inherent in subsystem 113 (which will be described in detail below) serve as a principal novel feature of the present invention.

In linear systems, it is well established that excitation of all of the frequencies in the target domain will result in a reasonable expectation of locating all linear distortions. However, with respect to nonlinear systems, it is to be understood that only through excitation of all of the multi-dimensional frequencies in the target domain will a reasonable expectation of locating all nonlinear distortions result.

When determining the type of excitation signal to be used to excite a nonlinear system, the two following factors should be considered.

First, with respect to a nonlinear subsystem of the type as represented herein (i.e., which includes an analog-to-digital converter), it is to be understood that the input signal s(n) is in the analog domain (i.e., continuous-time) whereas the distorted output signal x(n) is in the digital domain (i.e., sampled).

Second, with respect to a nonlinear subsystem of the type as represented herein, it is to be understood that such a subsystem has a relatively high dynamic range (which is further increased after the nonlinear equalization process). As a consequence, the excitation signals used with respect to nonlinear subsystem 113 should fall within levels commensurate with the equalized dynamic range. Specifically, in a linear system, acceptable excitation signals would result in amplitude accuracy within the range of approximately 0.1 dB to 0.001 dB of nominal value. By contrast, the above-defined range of amplitude accuracy would be unacceptable with respect to a nonlinear system since the present invention is designed principally to evaluate sources of nonlinear artifacts, such as intermodulation products, that fall within the range of approximately −40 dB to −120 dB below scale. To summarize, stable analog signal sources will not provide excitation signals with power levels known so as to yield sufficient accuracy.

Based on the factors enumerated above, the present invention utilizes multiple sets (i.e., files) of two or more tones (i.e., sinusoids) at several multi-dimensional frequencies within the band of interest to excite all of the relevant modes of nonlinearities inherent in nonlinear subsystem 113. As can be appreciated, the simultaneous use of multiple tones (e.g., three simultaneous tones) has been found to properly excite all the nonlinear modalities inherent in most RF receivers and analog-to-digital converters.

Using multiple sets of simultaneous tones, the analog input signal s(n) can be estimated using the unequalized digital signal x(n) that is generated by the nonlinear subsystem. As can be appreciated, the ability to estimate the analog input signal s(n) generated by test signal generator 415 results from the linear relationship between the linear filter coefficients of the equalizer and input signal s(n). This ability to estimate the analog input signal s(n) generated by signal test generator 415 is an important feature of the present invention since all signal test generators which are known in the art introduce, to a varying extent, inaccuracies with respect to the amplitude of its sinusoidal test signals. As such, the present invention allows for said inaccuracies in amplitude to be estimated using the measured distorted digital output x(n). In turn, by being able more accurately estimate the value of the input signal s(n) injected into the nonlinear system under test, a greater degree of optimization can be achieved in the process of identifying the equalization coefficients, thereby improving the overall performance of said equalizer, which is a principal novel feature of the present invention.

Figure 10:
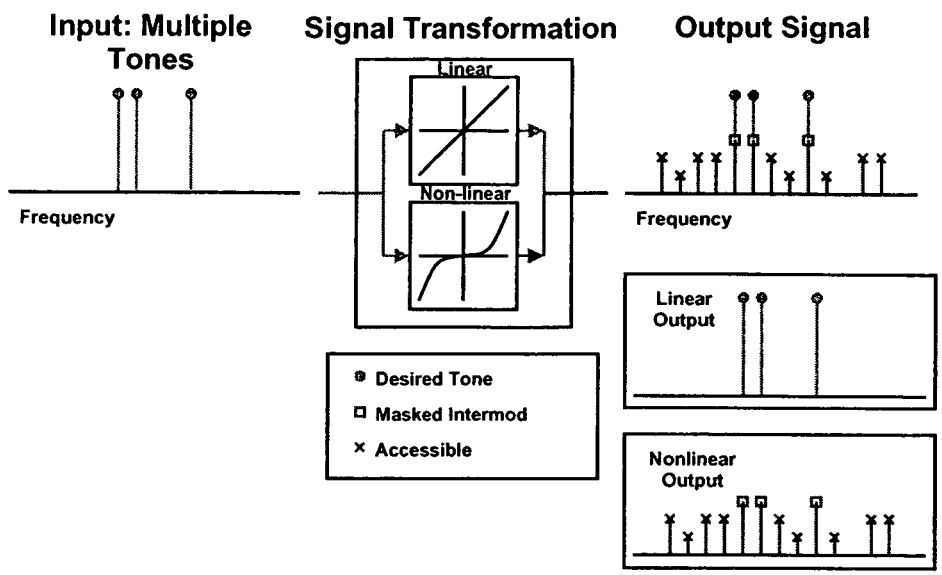
FIGS. 10(a)-(b) are various graphical representations which are useful in understanding the process by which the highly linear system shown in FIG. 9 can be used to estimate the "true" value of sets of test signals generated by the test signal generator.
Figure 10:
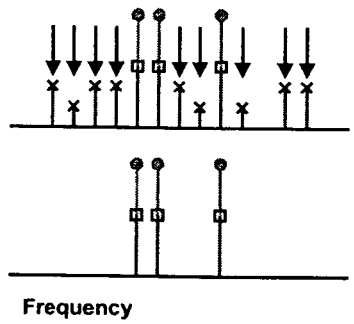
Figure 10:
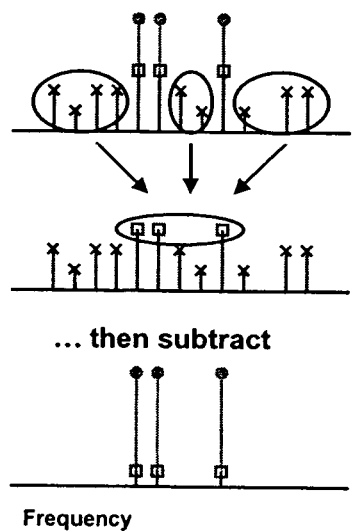

Referring now to FIGS. 10(a)-(b), there are shown various graphical depictions which are useful in understanding the process by which highly linear system 411 can be used to estimate the "true" value of the test signals generated by test signal generator 415.

As seen in FIG. 10(a), there is shown a frequency domain representation of a three tone input signal. The three tone input signal is shown injected into system which exhibits both linear and nonlinear characteristics. The resulting output signal includes both a linear output of the three tone input signal (said linear output being shown in isolation and identified generally as "linear output") and a nonlinear output of the three tone input signal (said nonlinear output being shown in isolation and identified generally as "nonlinear output"). It should be noted that the nonlinear output includes both accessible signal components (i.e., signal components that are separate from the linear output) as well as masked intermodulation signal components (i.e., signal components that are masked by the linear output), each of said components being identified as such therein. As can be appreciated, because the masked intermodulation signal components fall directly on top of the linear input signals, these nonlinear components can not be readily filtered out from the output signal, which is highly undesirable.

Referring now to FIG. 10(b), there are shown two different techniques for estimating the "true" amplitude for the original three tone input signal using the distorted output signal generated by ADC system 113.

In the first technique (which is identified generally as the "Direct Approach"), the accessible (i.e., separable) nonlinear intermodulations are suppressed (i.e., removed), the suppression of said intermodulations being represented by a plurality of downwardly directed arrows in FIG. 10(b). Suppression of the separable nonlinear modulations yields the three tone signal shown therein, said signal serving as an estimation of the original three tone input signal.

In the second technique (which is identified generally as the "Better Approach"), the accessible (i.e., separable) nonlinear modulations as well as the linear output are identified and, in turn, are utilized to estimate the characteristics of the nonlinear system. The estimated characteristics are then used to estimate the presence of the hidden (i.e., masked) nonlinear intermodulations. Having estimated the masked intermodulations, the hidden modulations as well as the separable nonlinear modulations are suppressed from the output signal so as to yield a three tone signal which more accurately depicts the original three tone input signal.

The second technique described above could be modified in an implicit manner to provide a notable advantage. Simply stated, the second technique is folded into the equalizer coefficient identification stage "on the fly" (i.e., without necessitating a separate step) by not including the input FFT bins in the desired signal set.

Nonlinear Mapping in Multiple Dimensions

Traditionally, mathematical tools for reducing nonlinear signal distortions are performed in one-dimensional space. However, as will be described in detail below, the present invention identifies that mathematical tools for reducing nonlinear signal distortions achieve considerable benefits when performed in multi-dimensional space. Accordingly, it is to be understood that the practice of nonlinear signal reductions in multi-dimensional space serves as a principal novel feature of the present invention.

Referring now to FIGS. 11(a)-(d), there are shown a variety of signal representations which are useful in displaying the benefit of performing nonlinear signal reductions in multi-dimensional space. Specifically, in FIG. 11(a), there is shown a one-dimensional representation of a band-limited input signal x(n) that has been transformed into the frequency domain. Transmission of said input signal x(n) through a nonlinear system (e.g., subsystem 113) generates an output signal y(n) of the type shown in FIG. 11(b), wherein said output signal y(n) is similarly represented in a one-dimensional frequency domain. As can be seen in FIG. 11(b), the output signal y(n) includes both linear and nonlinear components which overlap one another. Because the linear and nonlinear components of output signal y(n) overlap one another when said output signal y(n) is represented in one-dimensional space, any linear filtering (i.e., separation) of said components is not possible using traditional linear filtering techniques.

However, it is to be understood that by analyzing the output signal of a nonlinear system in multiple dimensions, separation of the linear and nonlinear components is more readily possible using traditional linear filtering tools (in particular, when said input signal is partitioned in a plurality of subspace components). Specifically, referring now to FIG. 11(c), there is shown a two-dimensional representation of the output signal y(n) shown in FIG. 11(b), said signal being represented in the frequency domain. As can be seen, there are no harmonics present in the output signal y(n).

Collapsing the two-dimensional signal represented in FIG. 11(c) back into one-dimensional space through integration yields the signal shown in FIG. 11(d). As can be appreciated, the transformation of the one-dimensional output signal (as shown in FIG. 11(b)) into multiple dimensions (as shown in FIG. 11(c)) and, subsequent thereto, the collapse of said signal back into one dimension (as shown in FIG. 11(d)) yields an output signal which allows for greater separation of its linear component (i.e., the desired signal) from its nonlinear component (i.e., the nonlinear signal distortion), said linear component being represented by dashed lines D and said nonlinear component being represented by shaded boxes B-1 through B-4. As a result, the linear and nonlinear components of the output signal shown in FIG. 11(d) can be separated by first partitioning the output signal and then applying traditional linear filtering techniques, which is highly desirable.

The following is a mathematical example which is also useful in displaying the benefit of performing nonlinear signal filtering in multi-dimensional space:

Assume that the following represents the output signal generated by a nonlinear system:

$$y(t)=x^P(t). \tag{6}$$

wherein y(t) is the output of the nonlinear system measured in the time domain and $x^P(t)$ is a P-th order polynomial input signal measured in the time domain.

The output signal y(t) can then be rewritten in p dimensions as follows:

$$y(t_1, t_2, \ldots, t_p) = \prod_{i=1}^{p} x(t_i). \tag{7}$$

Conversion of the output signal into the frequency domain generates the following equation:

$$\hat{y}(f)=F(y(t)), \tag{8}$$

wherein F denotes the Fourier operator.

The output signal measured in the frequency domain can be rewritten in p dimensions as follows:

$$\hat{y}(f) = \underbrace{\hat{x}(f) * \ldots * \hat{x}(f)}_{p-times}, \tag{9}$$

wherein * denotes the convolution operator. It should be noted that the convolution of input signal samples causes energy spreading of the signal power in the frequency domain, which is highly undesirable. It is for this reason that analysis of nonlinear systems in one dimension has various shortcomings.

However, by applying the Fourier operator in each of the p-dimensions (i.e., by converting the output signal into a multi-dimensional representation), it can be seen that:

$$\hat{y}(f_1, \ldots, f_p) = \prod_{i=1}^{p} \hat{x}(f_i), \quad (10)$$

wherein said equation yields a multi-dimensional representation of the output signal that includes no use of the convolution operator. As a result, it is to be understood that the multi-dimensional representation of the output signal does not experience any energy spreading of the signal power, which is highly desirable.

In order to convert a multi-dimensional representation of an output signal measured in the time domain back to a one-dimensional representation of an output signal measured in the time domain, the following parameter is set:

$$t_1 = t_2 = \ldots = t_p = t. \quad (11)$$

However, in order to convert a signal from the p-dimensional frequency domain back to a one dimensional frequency domain description, the following direct equation can be used:

$$\hat{y}(f) = \int_{f_1, \ldots,} \ldots \int_{f_{p-1}} \hat{y}\left(f_1, \ldots, f_{p-1}, f - \sum_{i=1}^{p-1} f_i\right) \prod_{i=1}^{p-1} df_i. \quad (12)$$

Accordingly, the following represents a useful mathematical tool for transforming a signal in either of two ways: (1) between a single dimension in time and multiple dimensions in time and (2) between the time domain and the frequency domain:

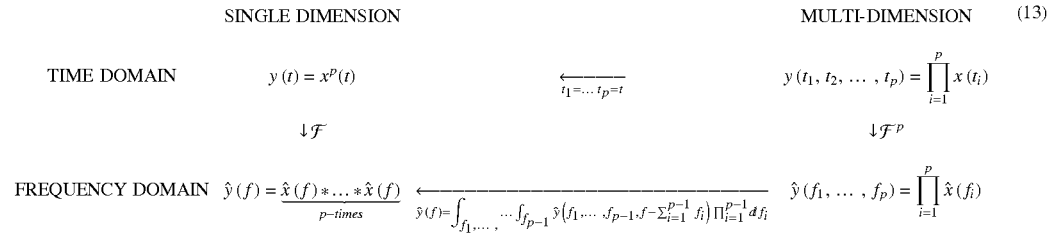

(13)

wherein the first row denotes signals represented in the time domain, the second row denotes signals represented in the frequency domain, the first column denotes signals represented in a single dimension, and the second column represents signals represented in multi-dimensions.

To summarize, it is to be understood that a signal transmitted through a nonlinear system can filter out the nonlinear component of its output signal (i.e., the distortion products) from its linear component (i.e., the desired signal) using linear filtering techniques by analyzing said signal in higher dimensional space, wherein a P-th order polynomial output signal requires transformation into P-dimensions.

Measured Results and Additional Potential Applications

Figure 13:
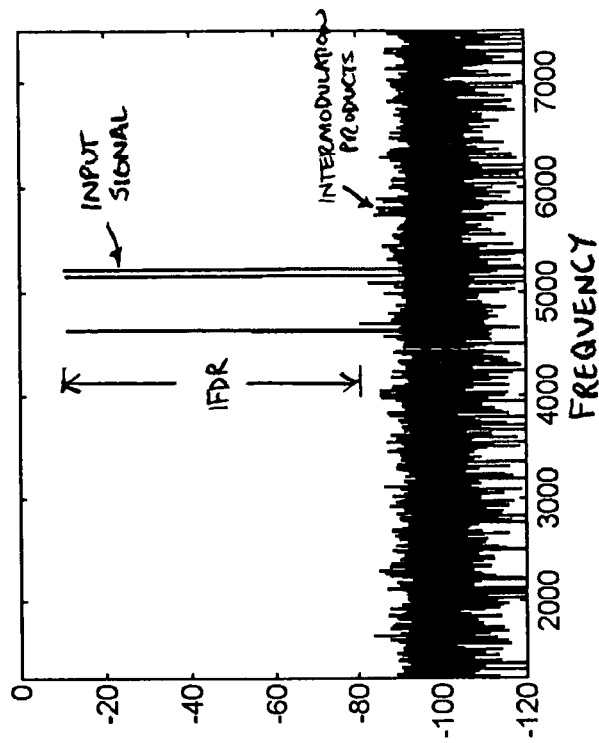
FIGS. 12 and 13 are graphical representations which are useful in displaying actual equalization results achieved using the nonlinear equalizer shown in FIG. 9;.
Figure 12:
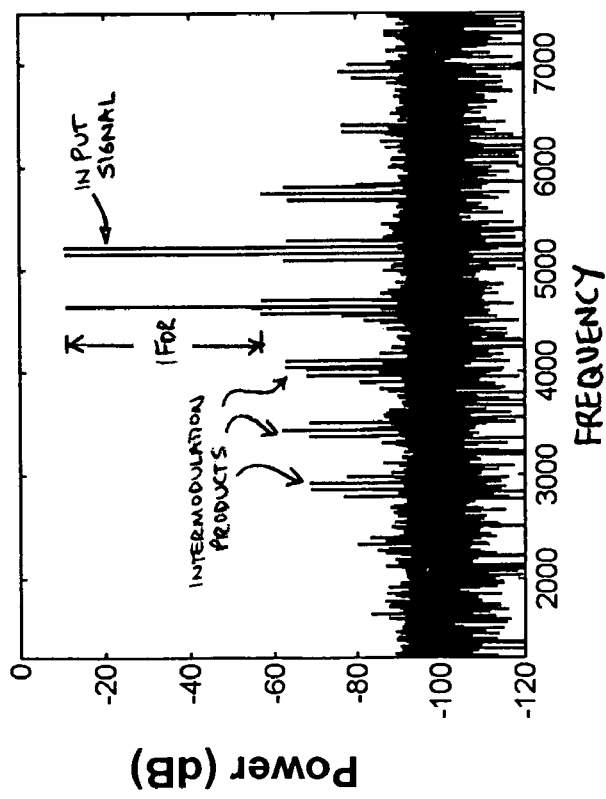

Referring now to FIGS. 12-13, there are shown graphical representations which are useful in displaying actual equalization results achieved using NLEQ 111. It is to be understood that the following example is being provided for illustrative purposes only and is no way intended to limit the scope of the present invention.

In FIG. 12, there is shown a graphical representation of an actual output signal generated using an analog-to-digital converter of the type manufactured and sold by Maxim Integrated Products, Inc., of Sunnyvale, Calif. under the model name of MAX108, the output signal resulting from an analog input signal having a frequency of 500 MHz that is sampled at 1.5 GSps. As can be seen, bands of nonlinear irregularities (identified herein as "intermodulation products") are shown with respect to an input signal (identified herein as "input signal"). The considerable strength of the intermodulation products serves to reduce the usable portion of the input signal that, in turn, can be utilized in digital signal processing (the usable portion of the input signal being identified as "IFDR" herein).

In FIG. 13, there is shown a graphical representation of the output signal shown in FIG. 12 after said output signal has been treated by NLEQ 111. As is readily apparent, NLEQ 111 is responsible for approximately 27 dB of linearity improvement in the portion of the input signal that can be used in processing (i.e., an increase in IFDR of approximately 27 dB).

It should be noted that, by increasing the linear dynamic range by approximately 30 db, improvements in signal processing performance can be realized by a factor of nearly 1,000 for a wide band receiver system (wherein 100 times greater performance is realized for signal improvement by 20 db, 1000 times greater performance is realized for signal improvement by 30 db, 10,000 times greater performance is realized for signal improvement by 40 db, etc.).

The improvements noted above in conjunction with the reduction of nonlinear distortion products provide a number of potential applications in the field of digital signal processing. For example, in conjunction with applications in radar, it is to be understood that the considerable reduction of nonlinear distortion products effectively increases the types of targets (i.e., targets approximately 1000 times smaller in size) that can be detected by radar, thereby improving the overall performance of the radar system. Other digital signal processing applications which may derive notable improvements in performance include, inter alia, cellular signal transmission (e.g., as commonly utilized in cell phone communication technology) and any form of signal processing which utilizes a transmitter, receiver and/or an analog-to-digital converter.

As noted above, a number of additional modifications and/or applications of NLEQ 115 could be realized without departing from the spirit of the present invention.

Figure 14:
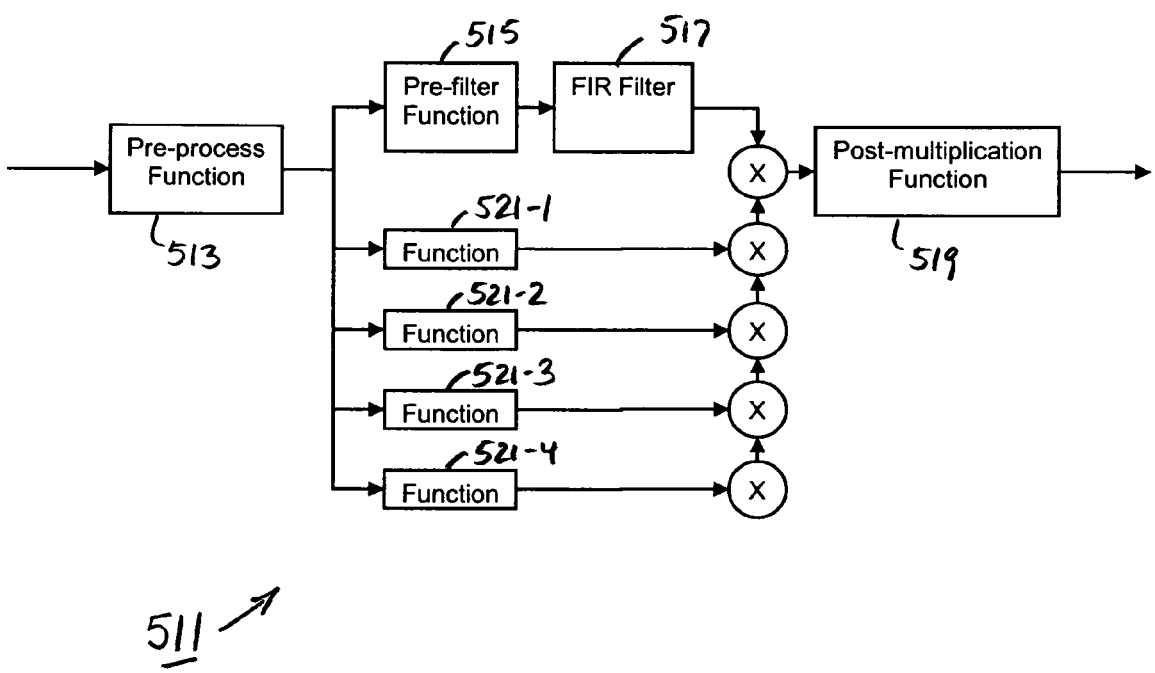
FIG. 14 is a simplified block diagram of one of the nonlinear processing units shown in FIG. 3, said nonlinear processing unit being represented in a generalized form which is useful in understanding further applications of the nonlinear equalizer of the present invention.

Referring now to FIG. 14, a nonlinear processing unit 121 from NLEQ 115 is represented in a more generalized form, said notional processing unit being identified generally by reference numeral 515. Simply stated, the more generalized form of notional processing unit 515 suggests that additional potential applications for NLEQ 115 are readily realizable.

Nonlinear processing unit 511 includes a pre-process function 513, a pre-filter function 515, an FIR filter 517, a post-multiplication function 519 and a plurality of individual partitioning functions 521-1 through 521-4.

It is important to note that pre-process function 513 may be in the form of a variable delay that appears at the front end of nonlinear processing unit 511. In this manner, pre-process function 513 would serve to introduce a delay into the input signal that is applied to both linear filter 517 and the partitioning functions 521. This delay to the input signal allows each nonlinear processing unit 511 to act with various delays in relation to the linear pass-through signal as well as relative to one another. Accordingly, this relative delay is extremely important to accommodate the wide degree of causality that may be exhibited by the nonlinear distortions during the identification process. This is especially important for the HCS architecture described above which relies heavily upon numerical stability during the identification process.

Functions 521 may be in the form of partitioning filters or any other similar device (whether linear or nonlinear in nature). With the exception of the linear FIR filter 517 all other components in notational processing unit 511 can be chosen depending on the particular need of processing unit 511 (i.e., whether device dependent, signal dependent or task dependent).

Figure 15A:
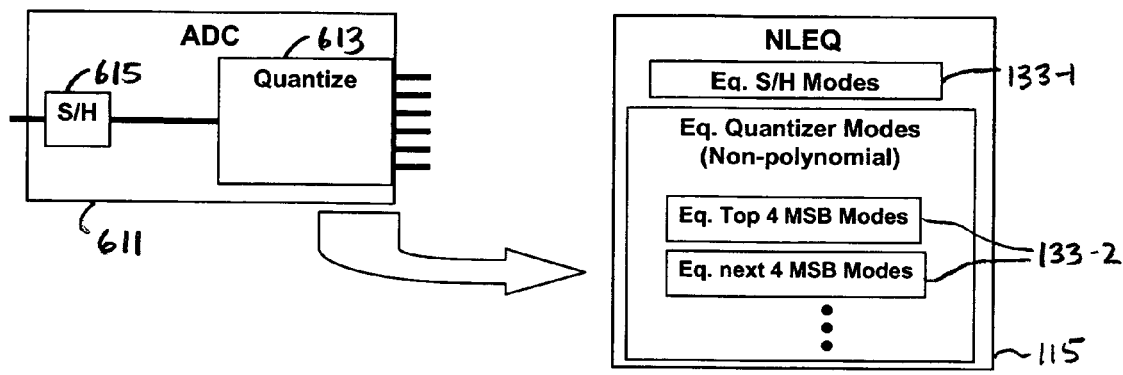
FIGS. 15(a)-(b) are simplified block diagrams depicting the relationship between sample nonlinear subsystems and the nonlinear equalizer shown in FIG. 2, said block diagrams being useful in understanding how partitioning filterbank 131 enables a design engineer to modify the architecture of NLEQ 115 to most suitably treat the particular nonlinear modalities in each nonlinear subsystem.
Figure 15B:
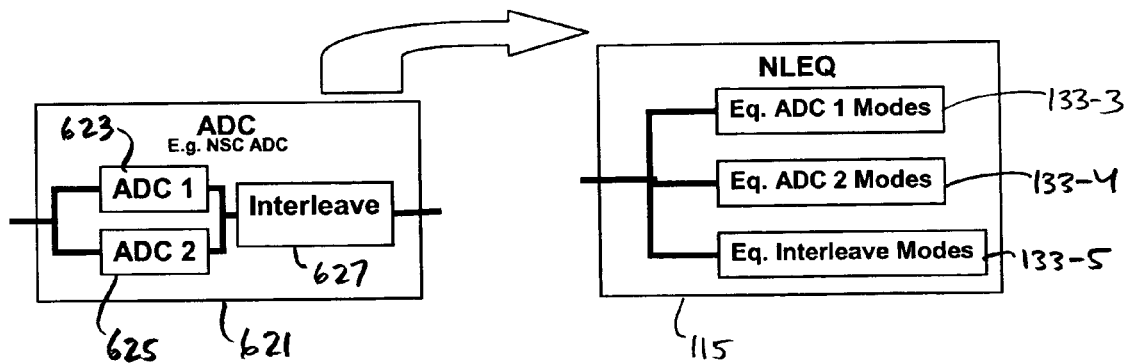

Referring now to FIGS. 15(a)-(b), there are shown simplified block diagrams which depict the relationship between sample nonlinear subsystems and the nonlinear equalizer of the present invention, said block diagrams being useful in understanding how partitioning filterbank 131 enables a design engineer to modify the architecture of NLEQ 115 to most suitably treat the particular nonlinear modalities in each nonlinear subsystem. Stated another way, individual partition filters 133 in partitioning filterbank 131 can be effectively assigned to treat a particular nonlinear modality in its associated nonlinear subsystem, thereby rendering NLEQ 115 more efficient.

In FIG. 15(a), there is shown a nonlinear subsystem 611 which is represented herein as being in the form of an analog-to-digital converter with both known quantization distortions 613 and known sample and hold nonlinear distortions 615. As can be seen, the architecture of NLEQ 115 can be modified such that some of its partition filters 133-1 are assigned to treat the quantization distortions 613 and other of its partition filters 133-2 are assigned to treat the sample and hold nonlinear distortions. Although not shown herein, some other modalities of NLEQ 115 may be assigned to treat saturation type nonlinearities that are created by a front end RF amplifier.

Referring now to FIG. 15(b), there is shown a nonlinear subsystem 621 which is represented herein as being in the form of an analog-to-digital converter with first and second sub-ADCs 623 and 625 that have their samples interleaved by an interleaver 627 to improve the overall speed of performance for ADC 621. As can be seen, the architecture of NLEQ 115 can be modified such that some of its partition filters 133-3 are assigned to treat the nonlinear modalities associated with first sub-ADC 623, other partition filters 133-4 are assigned to treat the nonlinear modalities associated with second sub-ADC 625 and yet other partition filters 133-5 are assigned to treat the nonlinear modalities associated with interleaver 627.

As an extension of this application, it is to be understood that NLEQ 115 could be used in the opposite manner as an analysis tool. Specifically, because the partition filterbank 131 allows for the partitioning of various nonlinear modalities of the nonlinear subsystem, it is to be understood that NLEQ 115 can be used to identify and locate the particular region or component of the nonlinear subsystem which is responsible for the greatest degree of nonlinear distortion. In this manner, NLEQ 115 can be used to help redesign nonlinear systems in a manner so as to reduce the nonlinear distortion generated thereby.

Furthermore, it should be noted that when the structure of the nonlinear system is well-defined, the number of signal files required to excite the various nonlinear modalities in said system can be compressed (i.e., limited). In other words, rather than excite all of the nonlinear modalities of a system (which is time-consuming in nature) compressed excitation (the use of sparse signals of opportunity) can be implemented during the identification process due to the inherent partitioning structure of NLEQ 115, which is highly desirable. In this environment, it is to be understood that a compressed excitation technique would produce the same performance results as if a full excitation technique were used.

Figure 16:
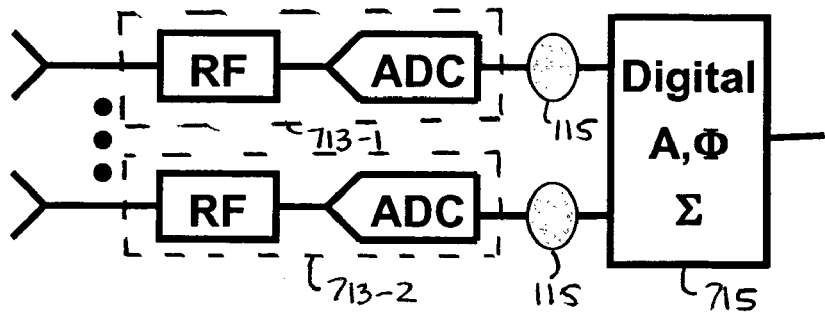
FIG. 16 is an array of nonlinear systems, said array including a plurality of the nonlinear equalizers shown in FIG. 2, each equalizer being assigned to a particular nonlinear element.

The principals described above in conjunction with NLEQ 115 could be implemented with respect to arrays of nonlinear devices. Specifically, referring now to FIG. 16, there is shown an array of nonlinear systems, said array being identified generally by reference numeral 711. As can be seen, array 711 is an element level digitization array that includes a plurality of nonlinear systems 713-1 and 713-2 (each of which is represented as being in the form a receiver operating a particular channel) which are then combined together using device 715. In this application, an individual NLEQ 115 is used to treat the distorted output produced by each nonlinear system 713 prior to summation.

Figure 17:
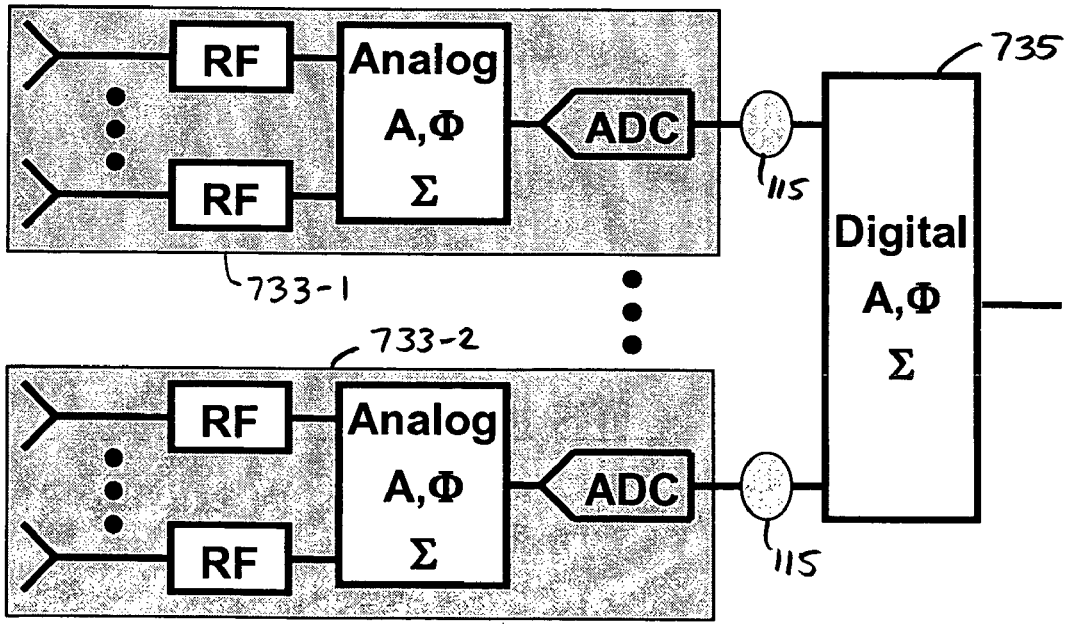
FIG. 17 is an array of nonlinear subarrays, said array including a plurality of the nonlinear equalizers shown in FIG. 2, each equalizer being assigned to a particular nonlinear subarray.
Figure 18A:
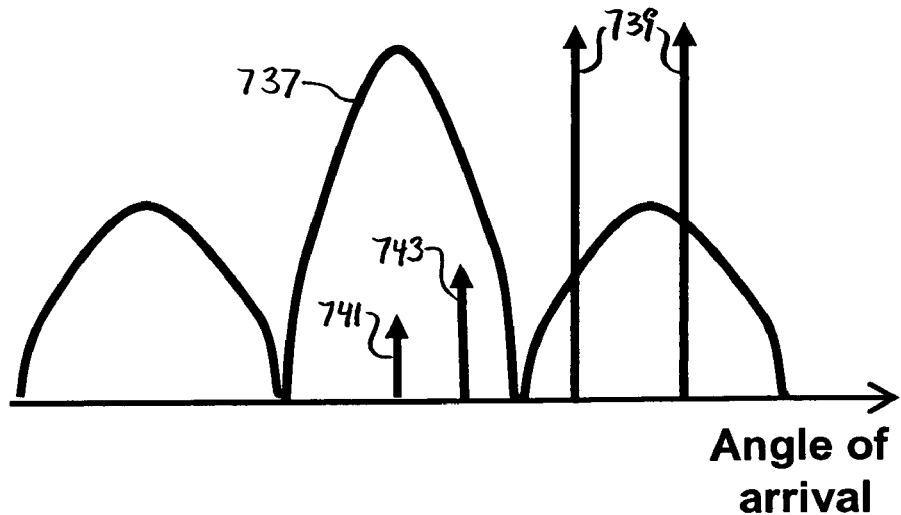
FIGS. 18(a)-(b) are two simplified signal representations which are useful in understanding the benefits associated with adaptive beam forming using the nonlinear equalizer shown in FIG. 2.
Figure 18B:
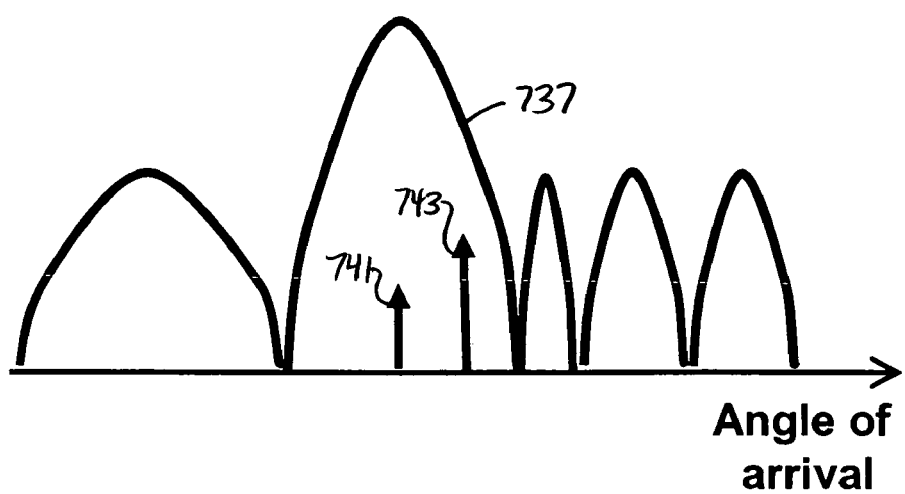

In FIG. 17 there is shown another array of nonlinear systems, said array being identified generally by reference numeral 731. As can be seen array 731 is a sub-array digitization array which includes a plurality of sub-arrays 733-1 and 733-2 which are then combined together using device 735. In this application, an individual NLEQ 115 is used to treat the distorted output produced by each sub-array 733 prior to summation. It is important to note that, in this example of RF component nonlinearities, NLEQ 115 is designed as a function of the beam-forming weights (thereby creating a process of adaptive beam forming). For greater ease in understanding this feature, there is shown in FIG. 18(a) an simplified graphical representation of an antenna beam pattern 737 shown with respect to a pair of jammer signals 739, a target signal 741 and a cross-modulation product 743. As can be seen, jammer signals 739 are the dominant signal. However, by changing the beam-forming weights, we can effectively null out jammer signals 739 to create the adaptive beam forming representation shown in FIG. 18(b). In order to reduce cross-modulation product 743, NLEQ 115 is designed as a function of the beam-forming weights, as noted above.

Figure 19A:
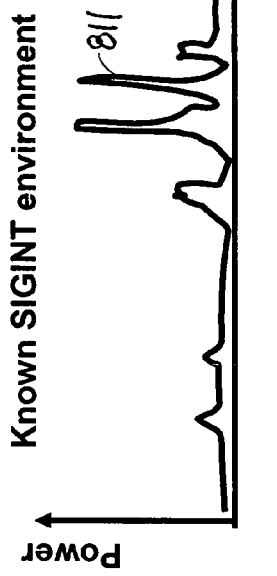
FIGS. 19(a)-(b) are two simplified signal representations which are useful in understanding the benefits associated with adaptive partitioning using the nonlinear equalizer shown in FIG. 2.
Figure 19B:
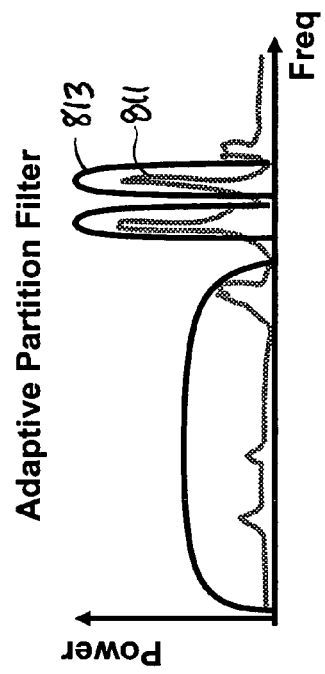

Referring now to FIGS. 19(a)-(b), there are shown two simplified signal representations which are useful in understanding how a priori knowledge of an input signal allows for the adaptive partitioning of the input signal into certain signal subspaces which, in turn, results in more efficient equalization. Specifically, in FIG. 19(a), there is shown an input signal 811 with certain known signal characteristics. In response thereto, as shown in FIG. 19(b), the partitioning filterbank can take advantage of the known signal characteristics and in turn break up the signal space (as represented by reference numeral 813) to more adaptively treat input signal 811, thereby improving the overall linear dynamic range of the signal without increasing the complexity or computational density of NLEQ 115.

Figure 20A:
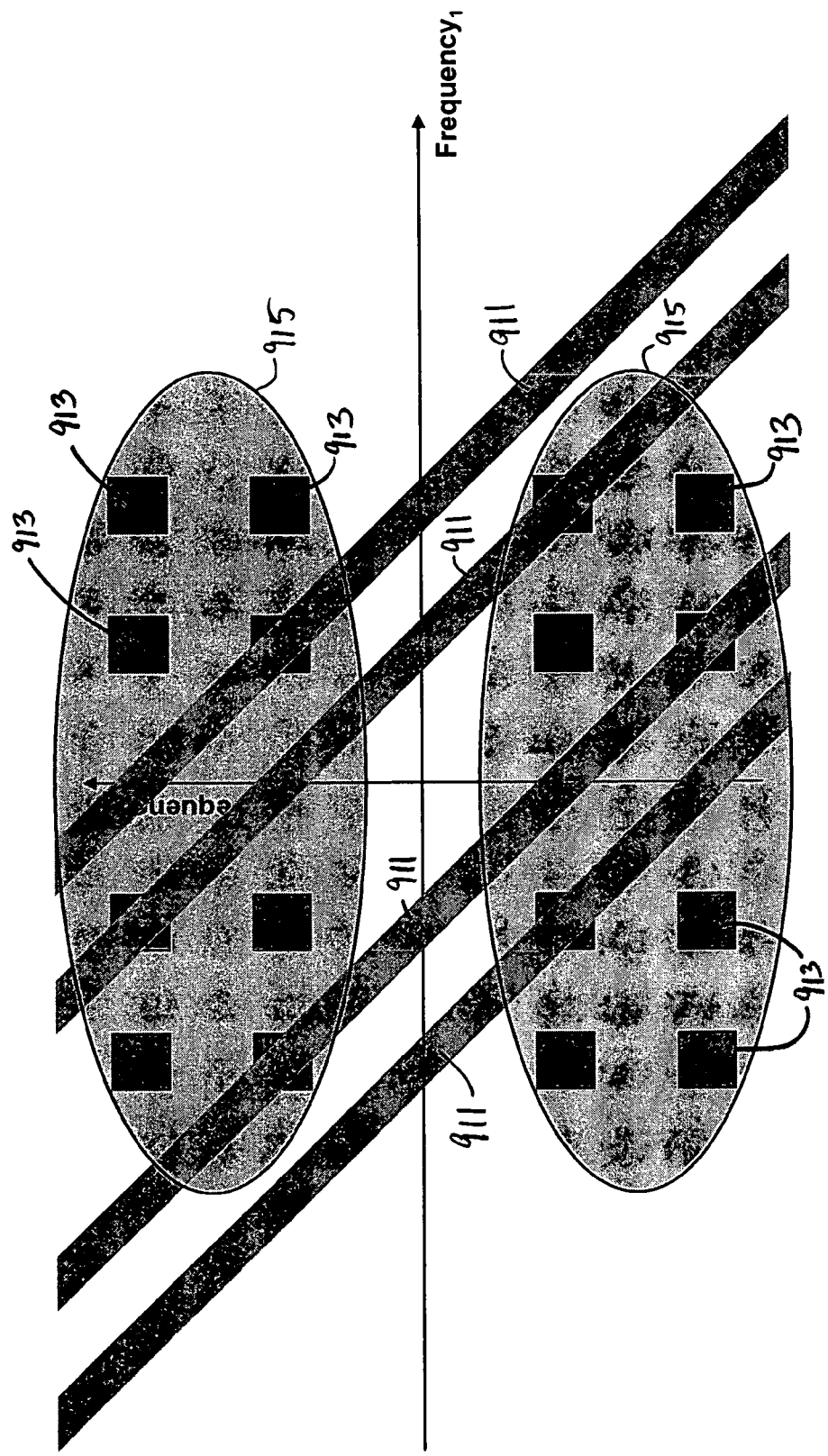
FIGS. 20(a)-(b) are two simplified multi-linear signal representations which are useful in understanding the benefits associated with adaptive partitioning using the nonlinear equalizer shown in FIG. 2.
Figure 20B:
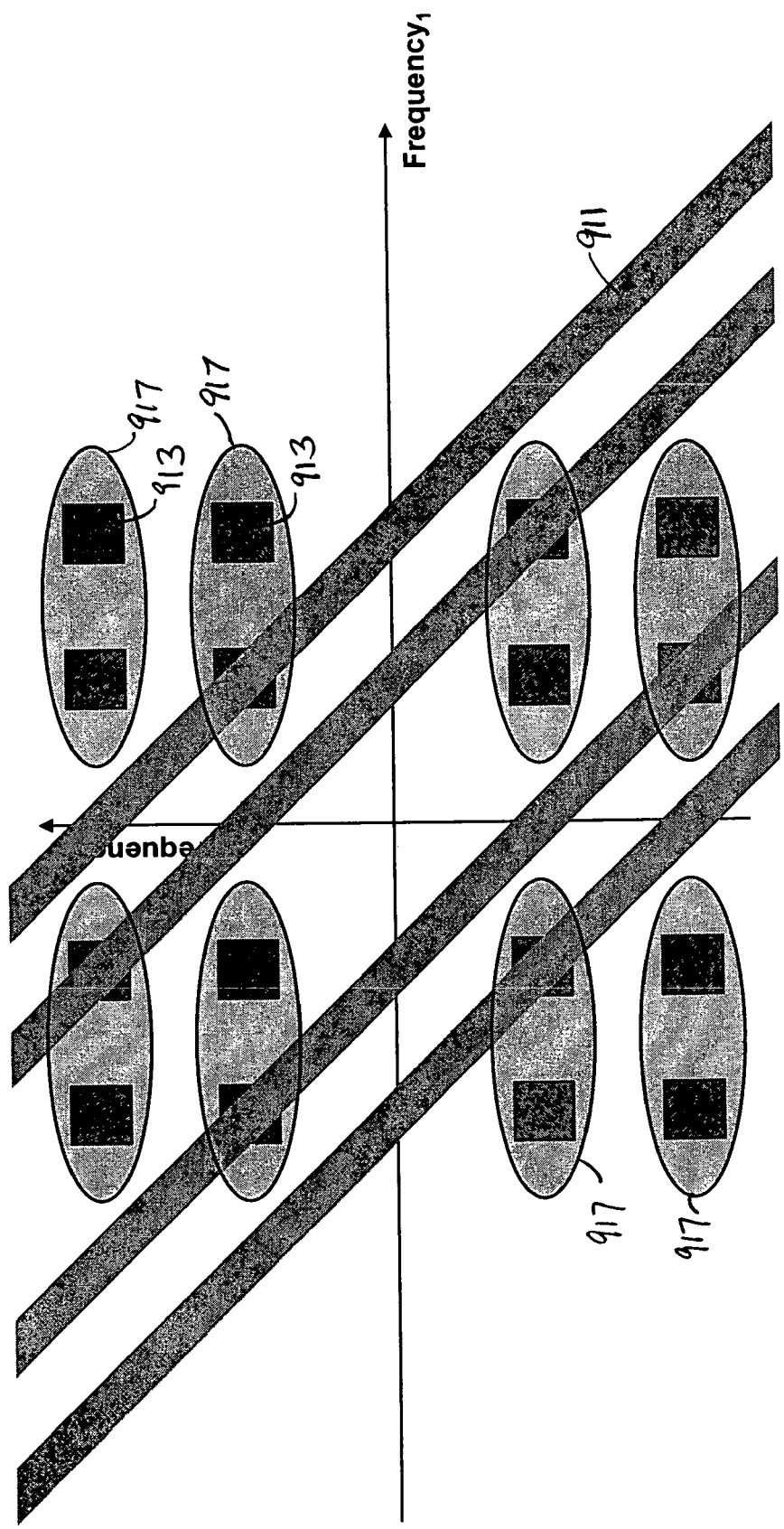

As an extension of this example, there is shown in FIG. 20(*a*) a simplified representation of a distorted output signal that is displayed in multi-linear space. With the distorted signal represented in multiple dimensions, the desired component of the signal (represented by linear bands 911 for purposes of simplicity only) and the nonlinear (i.e., undesired) component of the signal (represented by squares 913) are readily separable. As a result, generalized partitioning of the distorted signal (represented by ovals 915) allows for filtering of the distortion products 913 without greatly disturbing the linear components 911. However, the application of adaptive partitioning allows for more efficient (i.e., "zooming in") partitioning of the distorted signal. Specifically, as shown in FIG. 20(*b*), adaptive partitioning of the distorted signal using a priori knowledge of the nonlinear characteristics (said partitioning being represented by ovals 917) allows for a greater ability to filter out distortion products 913 without compromising linear products 917. As a result, NLEQ 115 is rendered less computationally complex and is provided with more numerical stability during identification (i.e., better equalization performance at the same manufacturing cost).

As a further application of the present invention, it should be noted that one technology that allows NLEQ 115 to become a realizable system is the parallelization of the identification process. Without the ability to harness the computing power of a parallel computing platform, the identification process would take significantly longer that currently available. For example, parallelization could be used as part of the "greedy" processing unit selection process and coefficient identification as well as during simulation and performance evaluation once NLEQ 115 has been completed.

The embodiments shown of the present invention are intended to be merely exemplary and those skilled in the art shall be able to make numerous variations and modifications to them without departing from the spirit of the present invention. All such variations and modifications are intended to be within the scope of the present invention as defined in the appended claims.

What is claimed is:

1. A nonlinear equalizer for treating the nonlinear component of a distorted digital signal, said nonlinear equalizer comprising:
   (a) a first processing unit adapted to receive the distorted digital signal and yield an appropriate output signal in response thereto,
   (b) a second processing unit adapted to receive the distorted digital signal and yield an appropriate output signal in response thereto, and
   (c) a summation module for summing together the output signals from the first and second processing units so as to yield an equalized digital signal,
   (d) wherein each of said first and second processing units comprises
      (i) means for partitioning the distorted digital signal into a plurality of sub-components,
      (ii) a linear filter comprising at least one equalization coefficient that is optimized to treat nonlinear modalities present within one sub-component of the partitioned digital signal, and
      (iii) a multiplier for multiplying together the output of said linear filter with the output of said partitioning means.

2. A nonlinear equalizer for treating the nonlinear component of a distorted digital signal, said nonlinear equalizer comprising:
   (a) a first processing unit adapted to receive the distorted digital signal and yield an appropriate output signal in response thereto,
   (b) a second processing unit adapted to receive the distorted digital signal and yield an appropriate output signal in response thereto,
   (c) a summation module for summing together the output signals from the first and second processing units so as to yield an equalized digital signal, and
   (d) wherein each of said first and second processing units comprises,
      (i) a linear filter comprising an equalization coefficient,
      (ii) a partitioning filterbank for partitioning the distorted digital signal, and
      (iii) a multiplier for multiplying together the output of said linear filter with the output of said partitioning filterbank.

3. The nonlinear equalizer as claimed in claim 2 wherein the equalization coefficient for the linear filter has a linear correspondence with both the distorted digital signal and the equalized digital signal.

4. The nonlinear equalizer as claimed in claim 3 wherein said linear filter is in the form of a finite-duration impulse response (FIR) filter.

5. The nonlinear equalizer as claimed in claim 2 wherein said partitioning filterbank comprises a plurality of linear partition filters, the outputs of the plurality of linear partition filters being multiplied together by a multiplier.

6. A nonlinear equalizer for treating the nonlinear component of a distorted digital signal, said nonlinear equalizer comprising:
   (a) a first processing unit adapted to receive the distorted digital signal and yield an appropriate output signal in response thereto,
   (b) a second processing unit adapted to receive the distorted digital signal and yield an appropriate output signal in response thereto,
   (c) a partitioning filterbank that is commonly coupled to each of said first and second processing units, and
   (d) a summation module for summing together the output signals from the first and second processing units so as to yield an equalized digital signal,
   (e) wherein each of said first and second processing units comprises,
      (i) a linear filter having an equalization coefficient,
      (ii) an array of delay filters, and
      (iii) a multiplier for multiplying together the output of said linear filter with the output of said array of delay filters.

7. A method of treating the nonlinear component of a distorted digital signal produced by a nonlinear system, said method comprising the steps of:
   (a) providing a single nonlinear equalizer which comprises a partitioning filterbank and a linear filter, the partitioning filterbank comprising a plurality of partition filters, the outputs of said plurality of partition filters being multiplied together, the linear filter comprising at least one equalization coefficient,
   (b) selecting the value of each partition filter in the partitioning filterbank,
   (c) determining the multiplication order of the partition filters within the partitioning filterbank,
   (d) injecting a test signal into said nonlinear system, the nonlinear system producing a distorted test output signal in response thereto, said nonlinear equalizer generating an equalized test output signal in response to the distorted test output signal, (e) calculating the at least one equalization coefficient value for the linear filter that minimizes the nonlinear component of the distorted test output signal, (f) after said calculating step, partitioning said distorted digital signal using the partitioning filterbank, and (g) after said partitioning step, equalizing the partitioned digital signal using the linear filter.

8. The method of claim 7 wherein said calculation step is performed using the equation $y=UT[x]h$, where h corresponds to the at least one equalization coefficient value of the linear filter, y corresponds to the equalized test output signal, U corresponds to the output of the partitioning filterbank and T[x] corresponds to the output of the linear filter.

9. The method of claim 7 wherein the test signal injected into said nonlinear system is generated using a signal test generator.

10. The method of claim 9 wherein the test signal includes multiple sets of simultaneous sinusoidal tones.

11. The method of claim 10 wherein the amplitude of the test signal is estimated using the measured value of the distorted test output signal.

12. A nonlinear equalizer for treating the nonlinear component of a distorted digital signal, said nonlinear equalizer comprising:

(a) a first processing unit adapted to receive the distorted digital signal and yield an appropriate output signal in response thereto, (b) a second processing unit adapted to receive the distorted digital signal and yield an appropriate output signal in response thereto, and (c) a summation module for summing together the output signals from the first and second processing units so as to yield an equalized digital signal, (d) wherein each of said first and second processing units comprises, (i) a linear filter having an equalization coefficient, (ii) an array of delay filters, and (iii) a multiplier for multiplying together the output of said linear filter with the output of said array of delay filters.

* * * * *

UNITED STATES PATENT AND TRADEMARK OFFICE
CERTIFICATE OF CORRECTION

| | | |
|---|---|---|
| PATENT NO. | : 7,609,759 B2 | Page 1 of 1 |
| APPLICATION NO. | : 11/280970 | |
| DATED | : October 27, 2009 | |
| INVENTOR(S) | : Gil M. Raz et al. | |

It is certified that error appears in the above-identified patent and that said Letters Patent is hereby corrected as shown below:

Column 1, line 11, please insert the following statement:
--This invention was made with Government support under Contract No. F19628-00-C-0002, awarded by the U.S. Air Force. The Government has certain rights in this invention.--

Signed and Sealed this

Tenth Day of August, 2010

David J. Kappos
*Director of the United States Patent and Trademark Office*